(12) United States Patent
Uedaira et al.

(10) Patent No.: US 8,513,892 B2
(45) Date of Patent: Aug. 20, 2013

(54) ILLUMINANCE SENSOR, AND ELECTRONIC EQUIPMENT AND SEMICONDUCTOR DEVICE USING THE SAME

(75) Inventors: Yoshitsugu Uedaira, Kyoto (JP); Yuichiro Nakata, Kyoto (JP); Junji Fujino, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 299 days.

(21) Appl. No.: 13/125,457

(22) PCT Filed: Mar. 23, 2010

(86) PCT No.: PCT/JP2010/054945
§ 371 (c)(1),
(2), (4) Date: Apr. 21, 2011

(87) PCT Pub. No.: WO2010/110249
PCT Pub. Date: Sep. 30, 2010

(65) Prior Publication Data
US 2011/0260629 A1    Oct. 27, 2011

(30) Foreign Application Priority Data

Mar. 25, 2009  (JP) ................. 2009-074008
Apr. 17, 2009  (JP) ................. 2009-101173
Oct. 16, 2009  (JP) ................. 2009-239545
Dec. 15, 2009  (JP) ................. 2009-284346

(51) Int. Cl.
*H05B 37/02*    (2006.01)
*G01J 5/10*     (2006.01)
*G01J 5/20*     (2006.01)
*G01J 1/46*     (2006.01)

(52) U.S. Cl.
USPC ........................ 315/158; 250/208.2

(58) Field of Classification Search
USPC ............. 315/158, 155, 159; 250/208.2, 349, 250/338.4
See application file for complete search history.

(56) References Cited

U.S. PATENT DOCUMENTS 7,554,480 B2 *  6/2009  Nakata et al. ................. 341/172
2008/0012741 A1  1/2008  Nakata et al.

FOREIGN PATENT DOCUMENTS

| JP | 05-072029   | 3/1993 |
| JP | 2003-214950 | 7/2003 |
| JP | 2006-118965 | 5/2006 |
| JP | 2008-042886 | 2/2008 |
| JP | 2009-157349 | 7/2009 |

* cited by examiner

*Primary Examiner* — Daniel D Chang
(74) *Attorney, Agent, or Firm* — Fish & Richardson P.C.

(57) ABSTRACT

In an illuminance sensor, a photoelectric converter (1) includes three photosensors (PS), and each photosensor (PS) outputs a current as a difference between photocurrents generated in two photodiodes (PDA, PDB) having different light reception characteristics. Ratios between light receiving areas of the two photodiodes (PDA, PDB) in the three photosensors (PS) are different from each other, and the sum of positive currents among output currents of the three photosensors (PS) is constant for a given illuminance, regardless of the type of light source. A computation control unit (7) obtains illuminance based on the sum of the positive currents among the output currents of the three photosensors (PS).

22 Claims, 21 Drawing Sheets

| PDA3a (AREA RATIO 12.8) | PDA1a (AREA RATIO 15.25) | | PDA2a (AREA RATIO 12.8) |
|---|---|---|---|
| PDB3a (AREA RATIO 5.85) | PDB2 (AREA RATIO 4.5) | PDB1 (AREA RATIO 1.7) | PDB3b (AREA RATIO 5.85) |
| PDA2b (AREA RATIO 12.8) | PDA1b (AREA RATIO 15.25) | | PDA3b (AREA RATIO 12.8) |

FIG.13

| OPERATION MODE | DETAIL | SW1 | SW2 | SW3a SW3b | SW4a SW4b | SW5a SW5b | SW6a SW6b |
|---|---|---|---|---|---|---|---|
| A | CHARGING MODE FOR CAPACITOR 22 | ON | OFF | OFF | ON | OFF | ON |
| B | LARGE DISCHARGING MODE FOR CAPACITOR 22 | ON | OFF | ON | OFF | OFF | ON |
| C | SMALL DISCHARGING MODE FOR CAPACITOR 22 | OFF | OFF | OFF | ON | ON | OFF |
| D | DISCHARGING MODE FOR CAPACITOR 26 | OFF | ON | OFF | ON | OFF | ON |
| E | STOP MODE | OFF | OFF | OFF | ON | OFF | ON |

| OPERATION MODE | SW1 | SW2 | SW5a SW5b | SW6a SW6b | SW7 | SW8 |
|---|---|---|---|---|---|---|
| A | ON | OFF | OFF | ON | ON | OFF |
| B | ON | OFF | ON | OFF | ON | OFF |
| C | OFF | OFF | ON | OFF | OFF | ON |
| D | OFF | OFF | OFF | ON | OFF | ON |
| E | OFF | ON | OFF | ON | OFF | ON |

FIG.27

| OPERATION MODE | OPERATION DETAIL | SW1 | SW2 | SW3 | SW4 | SW5 | SW6 | SW7a SW7b | SW8a SW8b | SW9a SW9b | SW10a SW10b |
|---|---|---|---|---|---|---|---|---|---|---|---|
| A | CHARGING MODE FOR CAPACITOR 109 | ON | ON | OFF | OFF | OFF | ON | OFF | ON | OFF | ON |
| B | LARGE DISCHARGING MODE FOR CAPACITOR 109 | ON | ON | OFF | OFF | OFF | ON | ON | OFF | OFF | ON |
| C | SMALL DISCHARGING MODE FOR CAPACITOR 109 | ON | OFF | OFF | OFF | OFF | ON | OFF | ON | ON | OFF |
| D | DISCHARGING MODE FOR CAPACITOR 117 | ON | OFF | ON | OFF | OFF | ON | OFF | ON | OFF | ON |
| E | STANDBY MODE | OFF (ON) | ON | ON | OFF (ON) | ON (OFF) | ON (OFF) | OFF | ON | OFF | ON |
| F | INTEGRATION SUSPENSION MODE | OFF | ON | OFF | ON | OFF | ON | OFF | ON | OFF | ON |
| G | INTEGRATION RESUMPTION MODE | OFF | ON | OFF | ON | ON | OFF | OFF | ON | OFF | ON |

ILLUMINANCE SENSOR, AND ELECTRONIC EQUIPMENT AND SEMICONDUCTOR DEVICE USING THE SAME

TECHNICAL FIELD

The present invention relates to an illuminance sensor, and electronic equipment and a semiconductor device using the same, and in particular to an illuminance sensor provided with a capacitor charged with an output current of a photosensor, and electronic equipment and a semiconductor device using the same.

BACKGROUND ART

An analog/digital converter is used for various electronic equipment. For example, it is also used for an illuminance sensor. The illuminance sensor detects ambient brightness of a display device such as a mobile phone and a television, and adjusts brightness of the display device itself based on a detection result, in order to reduce power consumption.

Japanese Patent Laying-Open No. 2008-42886 (Patent Document 1) relates to an analog/digital converter that has been already proposed by the inventor of the present application, and an illuminance sensor using the same. A photodiode detects ambient light, converts it into a current, and outputs the current to the analog/digital converter. The analog/digital converter integrates the input current, and outputs a digital value in accordance with the level of the light detected by the photodiode.

Further, the illuminance sensor of Patent Document 1 includes a photosensor and a capacitor. While the capacitor is charged with an output current of the photosensor in a predetermined charging period, the capacitor is discharged every time when a charge amount in the capacitor reaches a predetermined charge amount. In response to termination of the charging period, a given current is caused to flow out from the capacitor, and illuminance at a location where the photosensor is installed is obtained based on the number in which the capacitor is discharged and time taken to cause all charges in the capacitor to flow out. Further, the photosensor is configured by connecting two photodiodes having different light reception characteristics (spectral sensitivities) in series, and outputs a current as a difference between photocurrents generated in the two photodiodes.

In addition, Japanese Patent Laying-Open No. 2009-157349 (Patent Document 2) relates to a display device, and FIG. 3 thereof shows a state where an external light sensor element and a position sensor element are arranged. The external light sensor element receives external light incident from a front side of a liquid crystal panel shown in FIG. 1 thereof, and is composed, for example, of a light receiving element including a photodiode. The position sensor is installed on a front side opposite to a back side on which a backlight is installed in FIG. 1 thereof, to detect the position of an object to be detected. The position sensor includes, for example, a photodiode, and is used to detect the position of an object to be detected, such as a finger of a user, a touch pen, or the like.

PRIOR ART DOCUMENTS

Patent Documents

Patent Document 1: Japanese Patent Laying-Open No. 2008-42886

Patent Document 2: Japanese Patent Laying-Open No. 2009-157349

SUMMARY OF THE INVENTION

Problems to be Solved by the Invention

However, the illuminance sensor of Patent Document 1 has a problem that, depending on the type of light source, the difference between the photocurrents generated in the two photodiodes becomes negative, and thus illuminance cannot be detected. In addition, depending on the type of light source, brightness seen with the human eye may not match a measurement result of the illuminance sensor.

Therefore, a main object of the present invention is to provide an illuminance sensor capable of accurately detecting illuminance regardless of the type of light source.

Means for Solving the Problems

An illuminance sensor in accordance with the present invention includes: a first photosensor outputting a current in accordance with light intensity; a second photosensor having a light receiving area different from that of the first photosensor, and outputting a current in accordance with light intensity; a first switch having a first terminal receiving the output current of the second photosensor and second and third terminals, and connecting the first terminal to one of the second and third terminals based on a first control signal; a first polarity detection circuit connected to the second terminal of the first switch for detecting polarity of an input current; a charge amount detection circuit connected to an output node of the first photosensor and the third terminal of the first switch for detecting a charge amount by integrating an input current; and a computation control unit outputting the first control signal based on a detection result of the first polarity detection circuit, and outputting a digital signal indicating illuminance at a location where the first and second photosensors are installed based on a detection result of the charge amount detection circuit.

Effects of the Invention

In the illuminance sensor in accordance with the present invention, polarity of the output current of the second photosensor is detected to select whether to integrate only the output current of the first photo sensor or to integrate the sum of the output currents of the first and second photosensors, based on a detection result. Therefore, illuminance can be accurately detected regardless of the type of light source.

BRIEF DESCRIPTION OF THE DRAWINGS

FIG. 13 is a view showing states of switches in operation modes shown in FIG. 12.

FIG. 27 is a view showing states of switches in operation modes shown in FIG. 26.

MODES FOR CARRYING OUT THE INVENTION

Embodiment 1

Figure 1:
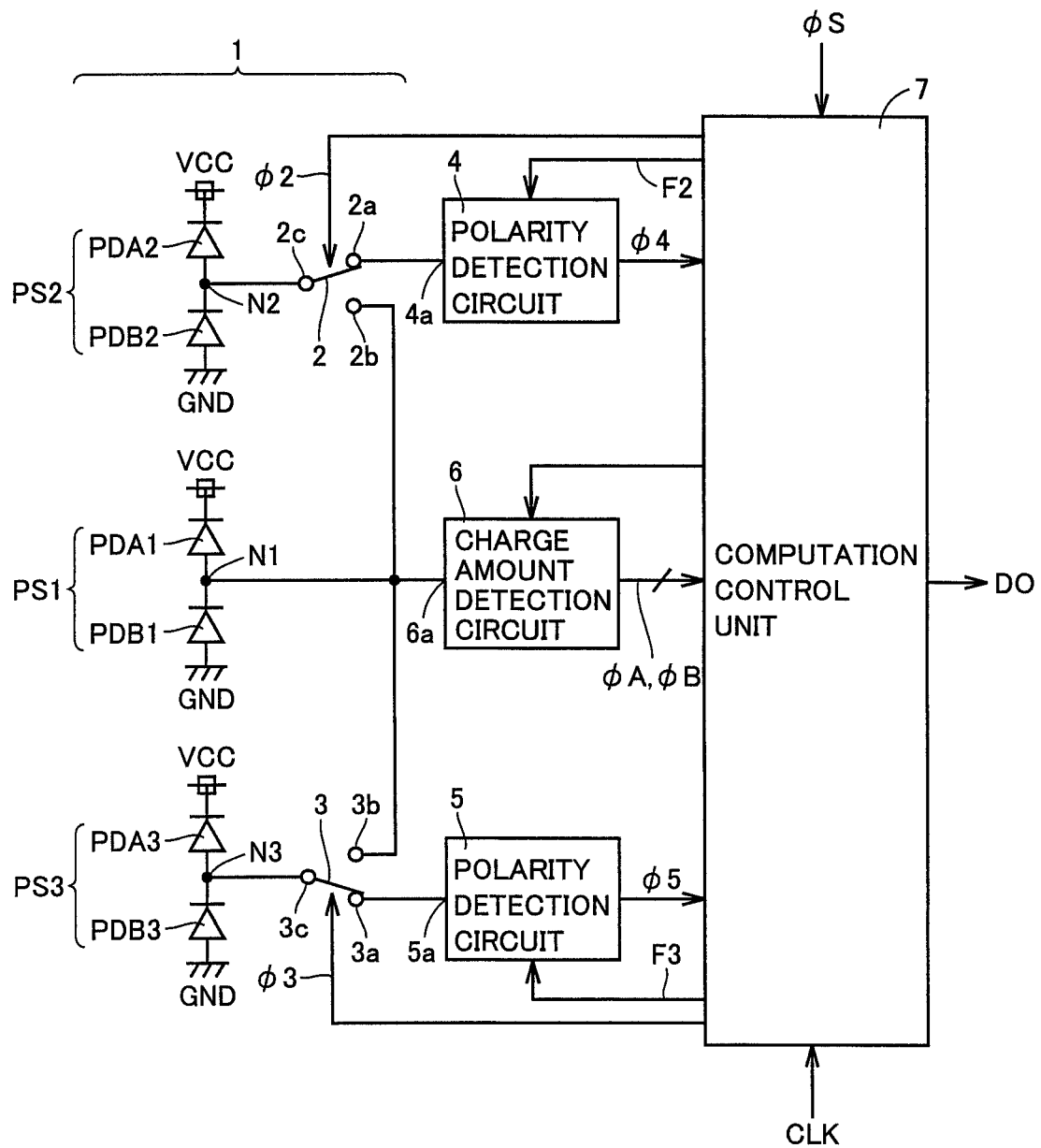
FIG. 1 is a circuit block diagram showing a configuration of an illuminance sensor in accordance with Embodiment 1 of the present invention.

FIG. 1 is a circuit block diagram showing a configuration of an illuminance sensor (ambient light sensor) in accordance with Embodiment 1 of the present invention. In FIG. 1, the illuminance sensor includes a photoelectric converter 1, polarity detection circuits 4, 5, and a computation control unit 7, and photoelectric converter 1 includes photosensors PS1 to PS3 and switches 2, 3.

Photosensor PS1 has photodiodes PDA1, PDB1, photosensor PS2 has photodiodes PDA2, PDB2, and photosensor PS3 has photodiodes PDA3, PDB3. Cathodes of photodiodes PDA1 to PDA3 receive a power supply voltage VCC, and anodes thereof are connected to output nodes N1 to N3 of photosensors PS1 to PS3, respectively. Cathodes of photodiodes PDB1 to PDB3 are connected to output nodes N1 to N3, respectively, and anodes thereof receive a ground voltage GND.

A photodiode PDA includes a PN junction formed in a shallow region of a semiconductor substrate, and is formed to have maximum sensitivity to light in the visible light range (for example, light with a wavelength of 600 nm). On the other hand, a photodiode PDB includes a PN junction formed in a deep region of the semiconductor substrate, and is formed to have maximum sensitivity to light in the infrared light range (for example, light with a wavelength of 860 nm). When light is emitted to a photosensor PS, a current I, which is a difference between a photocurrent IA generated in photodiode PDA and a photocurrent IB generated in photodiode PDB (I=IA−IB), is output to the output node.

Figure 2:
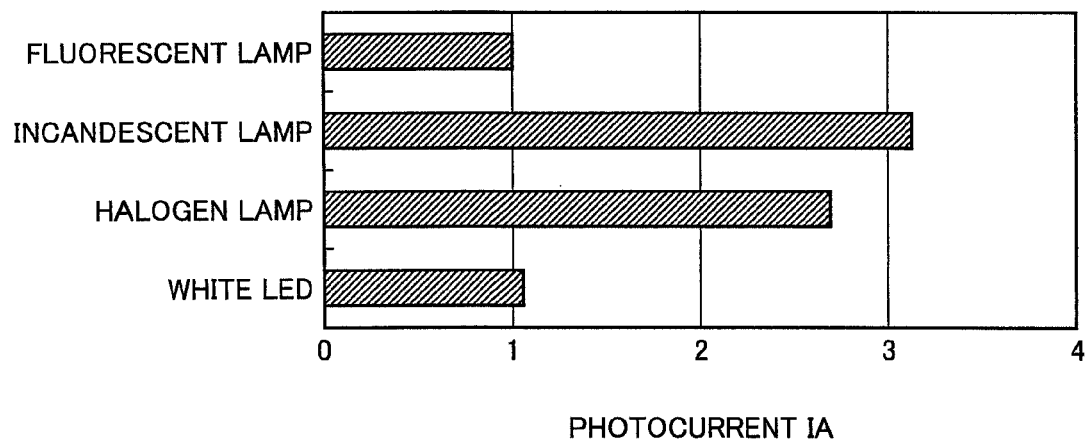
FIG. 2 is a view showing a photocurrent of a photodiode PDA shown in FIG. 1.

FIG. 2 is a view showing the level of photocurrent IA generated when light is emitted from a fluorescent lamp, an incandescent lamp, a halogen lamp, or a white LED (Light Emitting Diode) to photodiode PDA having a unit area. In FIG. 2, the level of photocurrent IA generated in photodiode PDA in response to the light from the fluorescent lamp is set to 1, and the level of photocurrent IA generated in photodiode PDA in response to the light from each light source is represented by a ratio thereof to the level of photocurrent IA generated in photodiode PDA in response to the light from the fluorescent lamp. Light emission intensities of the fluorescent lamp, the incandescent lamp, the halogen lamp, and the white LED are set such that the same illuminance can be obtained at a location where photodiode PDA is installed. However, different spectral distributions of the light from the fluorescent lamp, the incandescent lamp, the halogen lamp, and the white LED result in different photocurrents IA.

Figure 3:
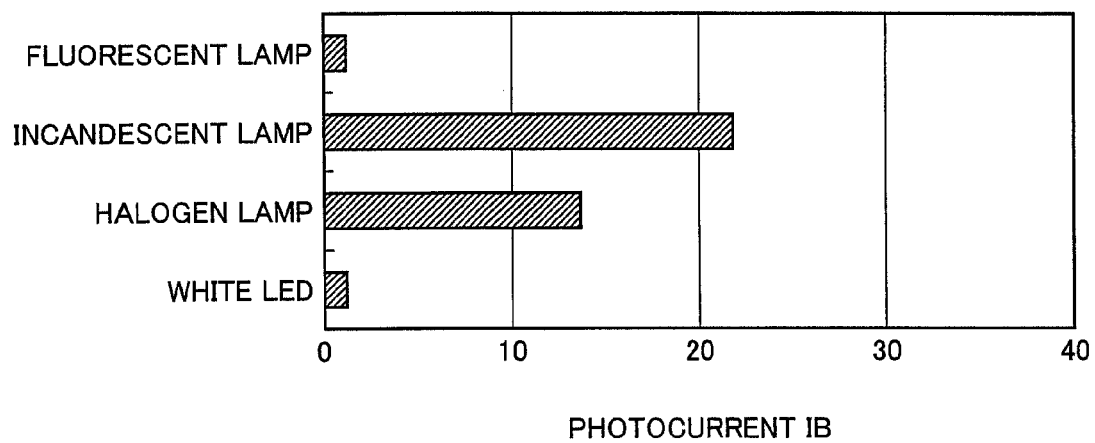
FIG. 3 is a view showing a photocurrent of a photodiode PDB shown in FIG. 1.

FIG. 3 is a view showing the level of photocurrent IB generated when light is emitted from a fluorescent lamp, an incandescent lamp, a halogen lamp, or a white LED to photodiode PDB having a unit area. In FIG. 3, the level of photocurrent IA generated in photodiode PDA in response to the light from the fluorescent lamp is set to 1, and the level of photocurrent IB generated in photodiode PDB in response to the light from each light source is represented by a ratio thereof to that of photocurrent IA generated in photodiode PDA in response to the light from the fluorescent lamp. Light emission intensities of the fluorescent lamp, the incandescent lamp, the halogen lamp, and the white LED are set such that the same illuminance can be obtained at a location where photodiode PDB is installed. However, different spectral distributions of the light from the fluorescent lamp, the incandescent lamp, the halogen lamp, and the white LED result in different photocurrents IB.

When FIG. 2 is compared with FIG. 3, it can be seen that photocurrents IB in response to the light from the incandescent lamp and the halogen lamp are much greater than photocurrents IA in response to the light from the incandescent lamp and the halogen lamp. This is because sensitivity of photodiode PDB is higher than that of photodiode PDA in the infrared light range.

Figures 4, 5:
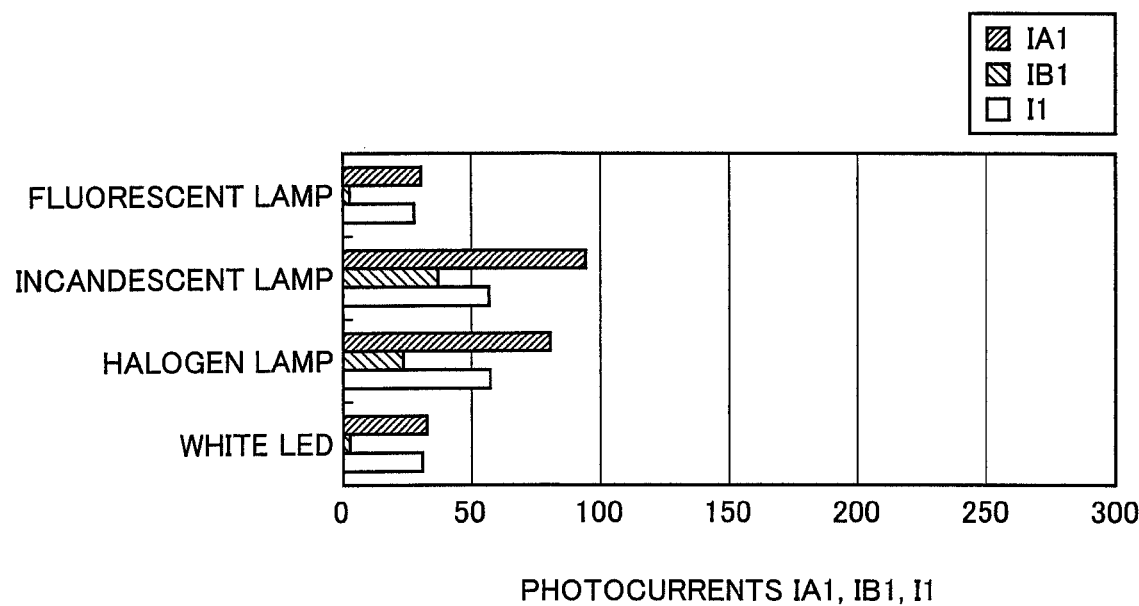
FIG. 4 is a view showing a layout of photodiodes shown in FIG. 1.
FIG. 5 is a view showing photocurrents of a photosensor PS1 shown in FIG. 1.

FIG. 4 is a view showing a layout of photodiodes PDA1 to PDA3 and PDB1 to PDB3. In FIG. 4, photodiodes PDA1 to PDA3 and PDB1 to PDB3 are arranged in a rectangular region on a surface of the semiconductor substrate. Photodiodes PDA1 to PDA3 and PDB3 are respectively divided into two photodiodes, namely, into photodiodes PDA1$a$ and PDA1$b$, PDA2$a$ and PDA2$b$, PDA3$a$ and PDA3$b$, and PDB3$a$ and PDB3$b$.

Photodiodes PDA2*a* and PDA2*b* are arranged at an upper right corner and a lower left corner, respectively, in the rectangular region in FIG. 4. Photodiodes PDA3*a* and PDA3*b* are arranged at an upper left corner and a lower right corner, respectively, in the rectangular region in FIG. 4. Photodiode PDA1*a* is arranged between photodiodes PDA3*a* and PDA2*a*. Photodiode PDA1*b* is arranged between photodiodes PDA2*b* and PDA3*b*. Photodiode PDB3*a* is arranged between photodiodes PDA3*a* and PDA2*b*. Photodiode PDB3*b* is arranged between photodiodes PDA2*a* and PDA3*b*. Photodiodes PDB2 and PDB1 are arranged between photodiodes PDB3*a* and PDA3*b*. With such arrangement, photosensors PS1 to PS3 can obtain the same optical characteristics such as directivity.

An area ratio between photodiodes PDA1 and PDB1 is set to 30.5:1.7. An area ratio between photodiodes PDA2 and PDB2 is set to 25.6:4.5. An area ratio between photodiodes PDA3 and PDB3 is set to 25.6:11.7.

FIG. 5 is a view showing the levels of photocurrents IA1, IB1, and I1 generated when light is emitted from a fluorescent lamp, an incandescent lamp, a halogen lamp, or a white LED to photodiodes PDA1, PDB1. It is to be noted that photocurrents IA1, IB1 are photocurrents generated in photodiodes PDA1, PDB1, respectively. Further, if IA1>IB1, I1=IA1−IB1, and if IA1≦IB1, I1 is 0. Furthermore, in FIG. 5, the level of photocurrent IA1, IB1, or I1 generated in response to the light from each light source is represented by a ratio thereof to that of photocurrent IA generated in photodiode PDA having a unit area in response to the light from the fluorescent lamp. For example, since the area ratio of photodiode PDA1 is 30.5, IA1 is 30.5.

In FIG. 5, due to the high area ratio between photodiodes PDA1 and PDB1 (30.5/1.7), IA1>IB1 is obtained for every light source, resulting in I1>0.

Figure 6:
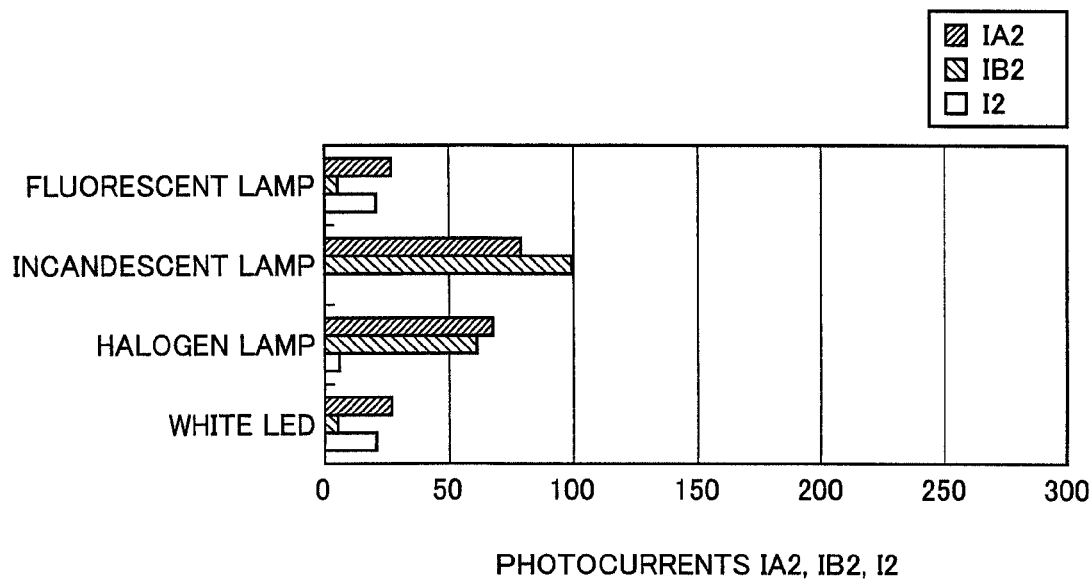
FIG. 6 is a view showing photocurrents of a photosensor PS2 shown in FIG. 1.

FIG. 6 is a view showing the levels of photocurrents IA2, IB2, and I2 generated when light is emitted from a fluorescent lamp, an incandescent lamp, a halogen lamp, or a white LED to photodiodes PDA2, PDB2. It is to be noted that photocurrents IA2, IB2 are photocurrents generated in photodiodes PDA2, PDB2, respectively. Further, if IA2>IB2, I2=IA2−IB2, and if IA2≦IB2, I2 is 0. Furthermore, in FIG. 6, the level of photocurrent IA2, IB2, or I2 generated in response to the light from each light source is represented by a ratio thereof to that of photocurrent IA generated in photodiode PDA having a unit area in response to the light from the fluorescent lamp. For example, since the area ratio of photodiode PDA2 is 25.6, IA2 is 25.6.

In FIG. 6, since the area ratio between photodiodes PDA2 and PDB2 (25.6/4.5) is lower than the area ratio between photodiodes PDA1 and PDB1 (30.5/1.7), the ratio between IA2 and IB2 is lower than the ratio between IA1 and IB1, and thus IA2<IB2 is obtained for the light from the incandescent lamp, resulting in I2=0.

Figure 7:
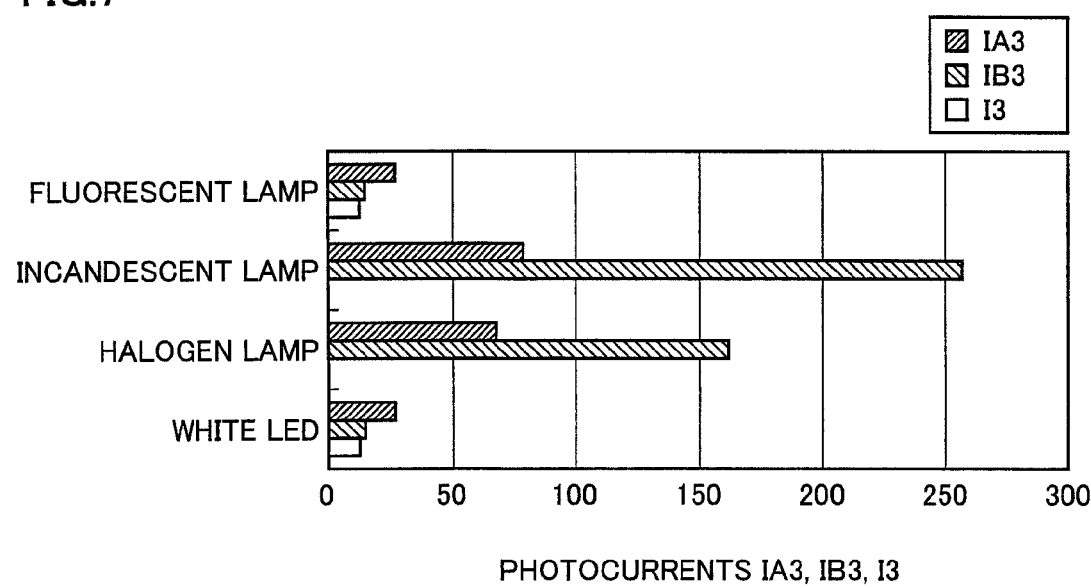
FIG. 7 is a view showing photocurrents of a photosensor PS3 shown in FIG. 1.

FIG. 7 is a view showing the levels of photocurrents IA3, IB3, and I3 generated when light is emitted from a fluorescent lamp, an incandescent lamp, a halogen lamp, or a white LED to photodiodes PDA3, PDB3. It is to be noted that photocurrents IA3, IB3 are photocurrents generated in photodiodes PDA3, PDB3, respectively. Further, if IA3>IB3, I3=IA3−IB3, and if IA3≦IB3, I3 is 0. Furthermore, in FIG. 7, the level of photocurrent IA3, IB3, or I3 generated in response to the light from each light source is represented by a ratio thereof to that of photocurrent IA generated in photodiode PDA having a unit area in response to the light from the fluorescent lamp. For example, since the area ratio of photodiode PDA3 is 25.6, IA3 is 25.6.

In FIG. 7, since the area ratio between photodiodes PDA3 and PDB3 (25.6/11.7) is lower than the area ratio between photodiodes PDA2 and PDB2 (25.6/4.5), the ratio between IA3 and IB3 is lower than the ratio between IA2 and IB2, and thus IA3<IB3 is obtained for the light from the incandescent lamp and the halogen lamp, resulting in I3=0.

Figure 8:
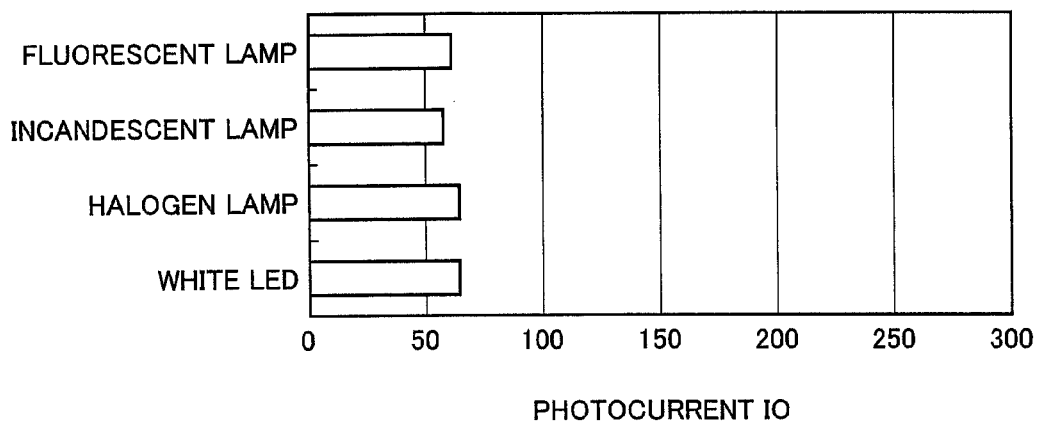
FIG. 8 is a view showing the sum of the photocurrents of the photosensors shown in FIGS. 5 to 7.

FIG. 8 is a view showing a sum IO of output currents I1 to I3 of photosensors PS1 to PS3 shown in FIGS. 5 to 7. As can be seen from FIG. 8, current IO is at a constant level for a given illuminance, regardless of the type of light source. It is to be noted that, when the light source is a fluorescent lamp, IO=I1+I2+I3, when the light source is an incandescent lamp, IO=I1, when the light source is a halogen lamp, IO=I1+I2, and when the light source is a white LED, IO=I1+I2+I3.

Turning back to FIG. 1, output node N1 of photosensor PS1 is connected to an input node 6*a* of a charge amount detection circuit 6 (an output node of photoelectric converter 1). Output node N2 of photosensor PS2 is connected to a common terminal 2*c* of switch 2, one switching terminal 2*a* of switch 2 is connected to an input node 4*a* of polarity detection circuit 4, and the other switching terminal 2*b* of switch 2 is connected to input node 6*a* of charge amount detection circuit 6. Switch 2 is controlled by a signal φ2 from computation control unit 7.

When signal φ2 is at an "L" level, conduction is established between terminals 2*a* and 2*c* of switch 2, and photosensor PS2 is coupled to polarity detection circuit 4. When signal φ2 is at an "H" level, conduction is established between terminals 2*b* and 2*c* of switch 2, and photosensor PS2 is coupled to charge amount detection circuit 6.

Output node N3 of photosensor PS3 is connected to a common terminal 3*c* of switch 3, one switching terminal 3*a* of switch 3 is connected to an input node 5*a* of polarity detection circuit 5, and the other switching terminal 3*b* of switch 3 is connected to input node 6*a* of charge amount detection circuit 6. Switch 3 is controlled by a signal φ3 from computation control unit 7.

When signal φ3 is at an "L" level, conduction is established between terminals 3*a* and 3*c* of switch 3, and photosensor PS3 is coupled to polarity detection circuit 5. When signal φ3 is at an "H" level, conduction is established between terminals 3*b* and 3*c* of switch 3, and photosensor PS3 is coupled to charge amount detection circuit 6.

Polarity detection circuit 4 is connected to photosensor PS2 via switch 2 when measurement of illuminance is started, quickly detects whether the output current of photosensor PS2 has positive polarity or negative polarity, and outputs a signal φ4 indicating a detection result.

Figure 9:
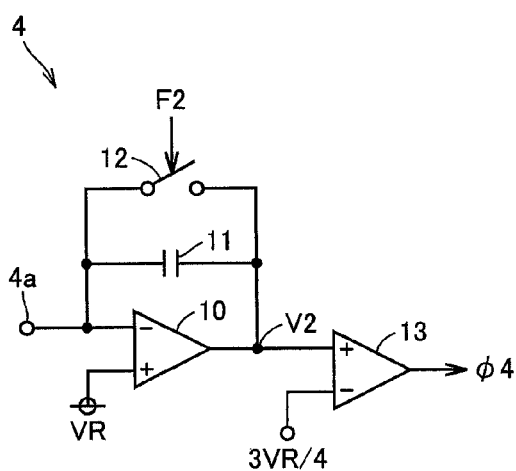
FIG. 9 is a circuit diagram showing a configuration of a polarity detection circuit 4 shown in FIG. 1.

Specifically, as shown in FIG. 9, polarity detection circuit 4 includes an operational amplifier 10, a capacitor 11, a switch 12, and a comparison circuit 13. A non-inverting input terminal (positive terminal) of operational amplifier 10 receives a reference voltage VR, and an inverting input terminal (negative terminal) thereof is connected to input node 4*a* of polarity detection circuit 4. Capacitor 11 is connected between the inverting input terminal and an output terminal of operational amplifier 10. A capacitance value of capacitor 11 is set, for example, to 1 pF. Switch 12 is controlled by a signal F2 from computation control unit 7, and is connected in parallel with capacitor 11. Comparison circuit 13 compares an output voltage V2 of operational amplifier 10 with a reference voltage 3VR/4, and sets signal φ4 to an "H" level if V2>3VR/4, and sets signal φ4 to an "L" level if V2≦3VR/4.

When signal F2 is at an "H" level, switch 12 is turned on, output voltage V2 of operational amplifier 10 becomes equal to voltage VR at the non-inverting input terminal, and signal φ4 attains an "H" level. When signal F2 attains an "L" level, switch 12 is turned off, and capacitor 11 is charged with the output current of photosensor PS2.

When the output current of photosensor PS2 has positive polarity, output voltage V2 of operational amplifier 10 declines, When V2 reaches reference voltage 3VR/4, signal φ4 falls from an "H" level to an "L" level. When signal φ4 falls to an "L" level, signal φ2 rises to an "H" level, and conduction is established between terminals 2b and 2c of switch 2 in FIG. 1.

When the output current of photosensor PS2 has negative polarity, output voltage V2 of operational amplifier 10 increases from reference voltage VR to power supply voltage VCC. In this case, signal φ4 remains at an "H" level, signal φ2 remains at an "L" level, and conduction is continuously established between terminals 2a and 2c of switch 2 in FIG. 1.

Polarity detection circuit 5 is connected to photosensor PS3 via switch 3 when measurement of illuminance is started, quickly detects whether the output current of photosensor PS3 has positive polarity or negative polarity, and outputs a signal φ5 indicating a detection result.

Figure 10:
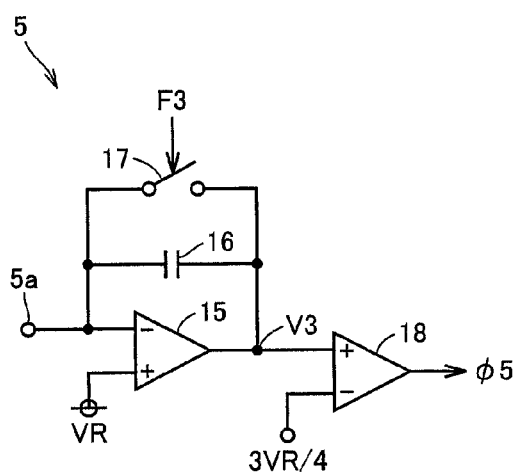
FIG. 10 is a circuit diagram showing a configuration of a polarity detection circuit 5 shown in FIG. 1.

Specifically, as shown in FIG. 10, polarity detection circuit 5 includes an operational amplifier 15, a capacitor 16, a switch 17, and a comparison circuit 18. A non-inverting input terminal (positive terminal) of operational amplifier 15 receives reference voltage VR, and an inverting input terminal (negative terminal) thereof is connected to input node 5a of polarity detection circuit 5. Capacitor 16 is connected between the inverting input terminal and an output terminal of operational amplifier 15. Switch 17 is controlled by a signal F3 from computation control unit 7, and is connected in parallel with capacitor 16. Comparison circuit 18 compares an output voltage V3 of operational amplifier 15 with reference voltage 3VR/4, and sets signal φ5 to an "H" level if V3>3VR/4, and sets signal φ5 to an "L" level if V3≦3VR/4.

When signal F3 is at an "H" level, switch 17 is turned on, output voltage V3 of operational amplifier 15 becomes equal to voltage VR at the non-inverting input terminal, and signal φ5 attains an "H" level. When signal F3 attains an "L" level, switch 17 is turned off, and capacitor 16 is charged with the output current of photosensor PS3.

When the output current of photosensor PS3 has positive polarity, output voltage V3 of operational amplifier 15 declines. When V3 reaches reference voltage 3VR/4, signal φ5 falls from an "H" level to an "L" level. When signal φ5 falls to an "L" level, signal φ3 rises to an "H" level, and conduction is established between terminals 3b and 3c of switch 3 in FIG. 1.

When the output current of photosensor PS3 has negative polarity, output voltage V3 of operational amplifier 15 increases from reference voltage VR to power supply voltage VCC. In this case, signal φ5 remains at an "H" level, signal φ3 remains at an "L" level, and conduction is continuously established between terminals 3a and 3c of switch 3 in FIG. 1.

Figure 11:
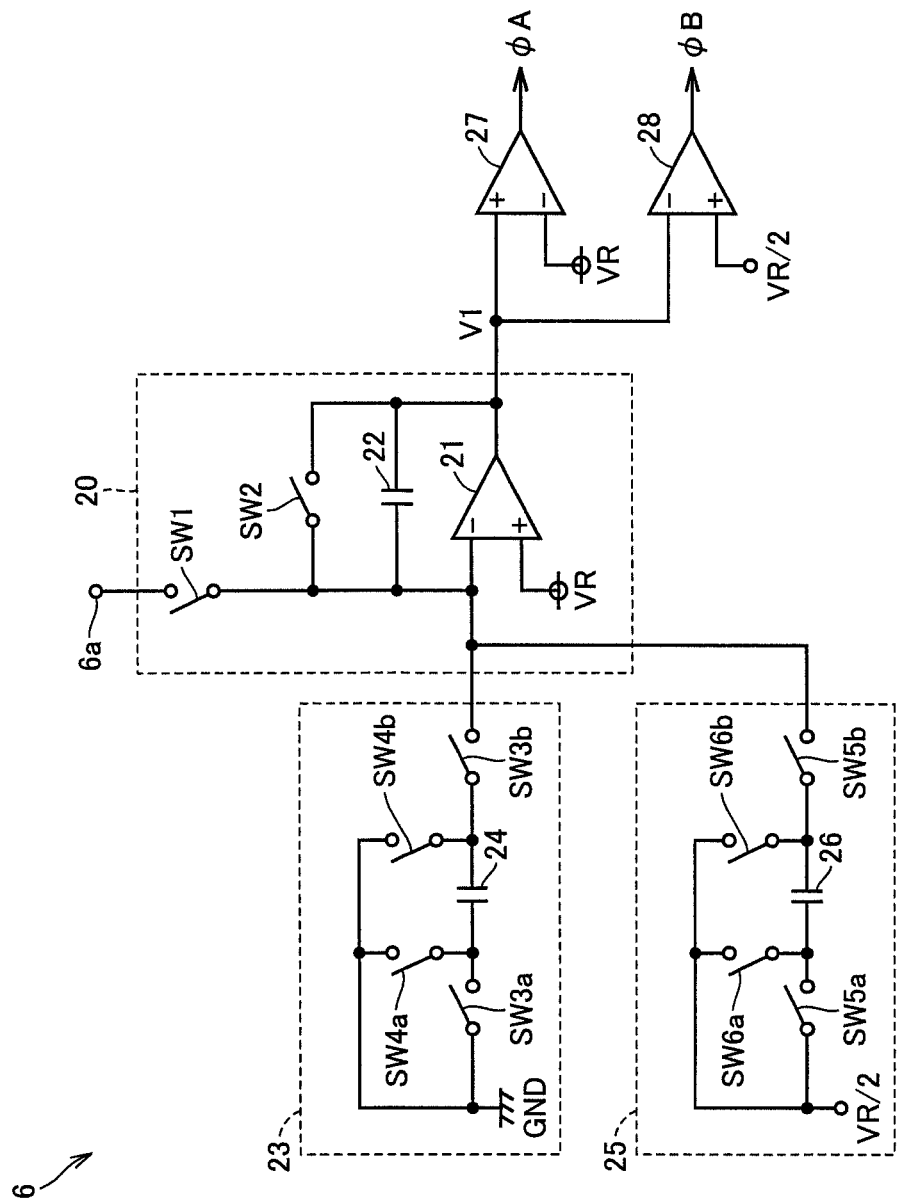
FIG. 11 is a circuit diagram showing a configuration of a charge amount detection circuit shown in FIG. 1.

Charge amount detection circuit 6 detects a charge amount generated in photoelectric converter 1 within a predetermined time, and outputs signals φA, φB indicating detection results. Specifically, as shown in FIG. 11, charge amount detection circuit 6 includes an integration circuit 20, discharging circuits 23, 25, and comparison circuits 27, 28.

Integration circuit 20 includes an operational amplifier 21, a capacitor 22, and switches SW1, SW2. Reference voltage VR is supplied to a non-inverting input terminal of operational amplifier 21. Capacitor 22 is connected between an inverting input terminal and an output terminal of operational amplifier 21. A capacitance value C22 of capacitor 22 is set, for example, to 64 pF. Switch SW1 is connected between input node 6a of charge amount detection circuit 6 and the inverting input terminal of operational amplifier 21. Switch SW2 is connected in parallel with capacitor 22.

When switch SW1 is turned off and switch SW2 is turned on, a short circuit occurs between terminals of capacitor 22 to cause a voltage across the terminals of capacitor 22 to be reset to 0 V, and voltages at the inverting input terminal and the output terminal become equal to reference voltage VR, which is a voltage at the non-inverting input terminal (an operation mode E). Next, when switch SW2 is turned off and switch SW1 is turned on, an output current of photoelectric converter 1 flows into capacitor 22 to charge capacitor 22 (operation modes A, B). When the voltage across the terminals of capacitor 22 increases, an output voltage V1 of operational amplifier 21 decreases. Subsequently, when switches SW1, SW2 are both turned off, charging of capacitor 22 is stopped (operation modes C, D).

Discharging circuit 23 includes a capacitor 24 and switches SW3a, SW3b, SW4a, SW4b. A capacitance value C24 of capacitor 24 is set to a value that is half capacitance value C22 of capacitor 22, for example, 32 pF. Switch SW3a, capacitor 24, and switch SW3b are connected in series between a line of ground voltage GND and the inverting input terminal of operational amplifier 21. Switch SW4a has one terminal receiving ground voltage GND, and the other terminal connected to one terminal of capacitor 24. Switch SW4b has one terminal receiving ground voltage GND, and the other terminal connected to the other terminal of capacitor 24.

When switches SW3a, SW3b are both turned off and switches SW4a, SW4b are both turned on, one terminal and the other terminal of capacitor 24 are each grounded, and a voltage across the terminals of capacitor 24 becomes 0 V (operation modes A, C, D, E). Next, when switches SW3a, SW3b are both turned on and switches SW4a, SW4b are both turned off, all charges accumulated in capacitor 22 are transferred to capacitor 24 (operation mode B). It is to be noted that a charge amount Q22 in capacitor 22 before transfer is represented as Q22=C22×VR/2. In addition, a charge amount Q24 in capacitor 24 after transfer is represented as Q24=C24×VR=(C22/2)×VR=Q22.

Discharging circuit 25 includes a capacitor 26 and switches SW5a, SW5b, SW6a, SW6b. A capacitance value C26 of capacitor 26 is set to a value that is one sixty-fourth capacitance value C22 of capacitor 22, for example, 1 pF. Switch SW5a, capacitor 26, and switch SW5b are connected in series between a node of a reference voltage VR/2 and the inverting input terminal of operational amplifier 21. Switch SW6a has one terminal receiving reference voltage VR/2, and the other terminal connected to one terminal of capacitor 26. Switch SW6b has one terminal receiving reference voltage VR/2, and the other terminal connected to the other terminal of capacitor 26.

When switches SW5a, SW5b are both turned off and switches SW6a, SW6b are both turned on, one terminal and the other terminal of capacitor 26 are each charged to reference voltage VR/2, and a voltage across the terminals of capacitor 26 becomes 0 V (operation modes A, B, D, E). Next, when switches SW5a, SW5b are both turned on and switches SW6a, SW6b are both turned off, a portion of the charges accumulated in capacitor 22 is transferred to capacitor 26 (operation mode C). It is to be noted that charge amount Q22 in capacitor 22 before transfer is represented as Q22=C22×VR/2. In addition, a charge amount Q26 in capacitor 26 after transfer is represented as Q26=C26×VR/2=(C22/64)×VR/2=Q22/64.

Comparison circuit 27 compares output voltage V1 of operational amplifier 21 with reference voltage VR, and sets signal φA to an "H" level if V1≧VR, and sets signal φA to an "L" level if V1<VR. Therefore, if the voltage across the terminals of capacitor 22 becomes 0 V, signal φA rises from an "L" level to an "H" level, and if charging of capacitor 22 is started, signal φA falls from an "H" level to an "L" level.

Comparison circuit 28 compares output voltage V1 of operational amplifier 21 with reference voltage VR/2, and sets signal φB to an "H" level if V1≦VR/2, and sets signal φB to an "L" level if V1>VR/2. Therefore, if the voltage across the terminals of capacitor 22 is lower than VR/2, signal φB attains an "L" level, and if the voltage across the terminals of capacitor 22 is not less than VR/2, signal φB rises from an "L" level to an "H" level.

Turning back to FIG. 1, computation control unit 7 operates in synchronization with a clock signal CLK, activates polarity detection circuits 4, 5 in response to an externally supplied measurement command signal φS, and controls switches 2, 3 based on output signals φ4, φ5 of polarity detection circuits 4, 5. Further, computation control unit 7 controls charge amount detection circuit 6, obtains illuminance based on output signals φA, φB of charge amount detection circuit 6, and outputs a digital signal DO indicating the obtained illuminance.

Figure 12:
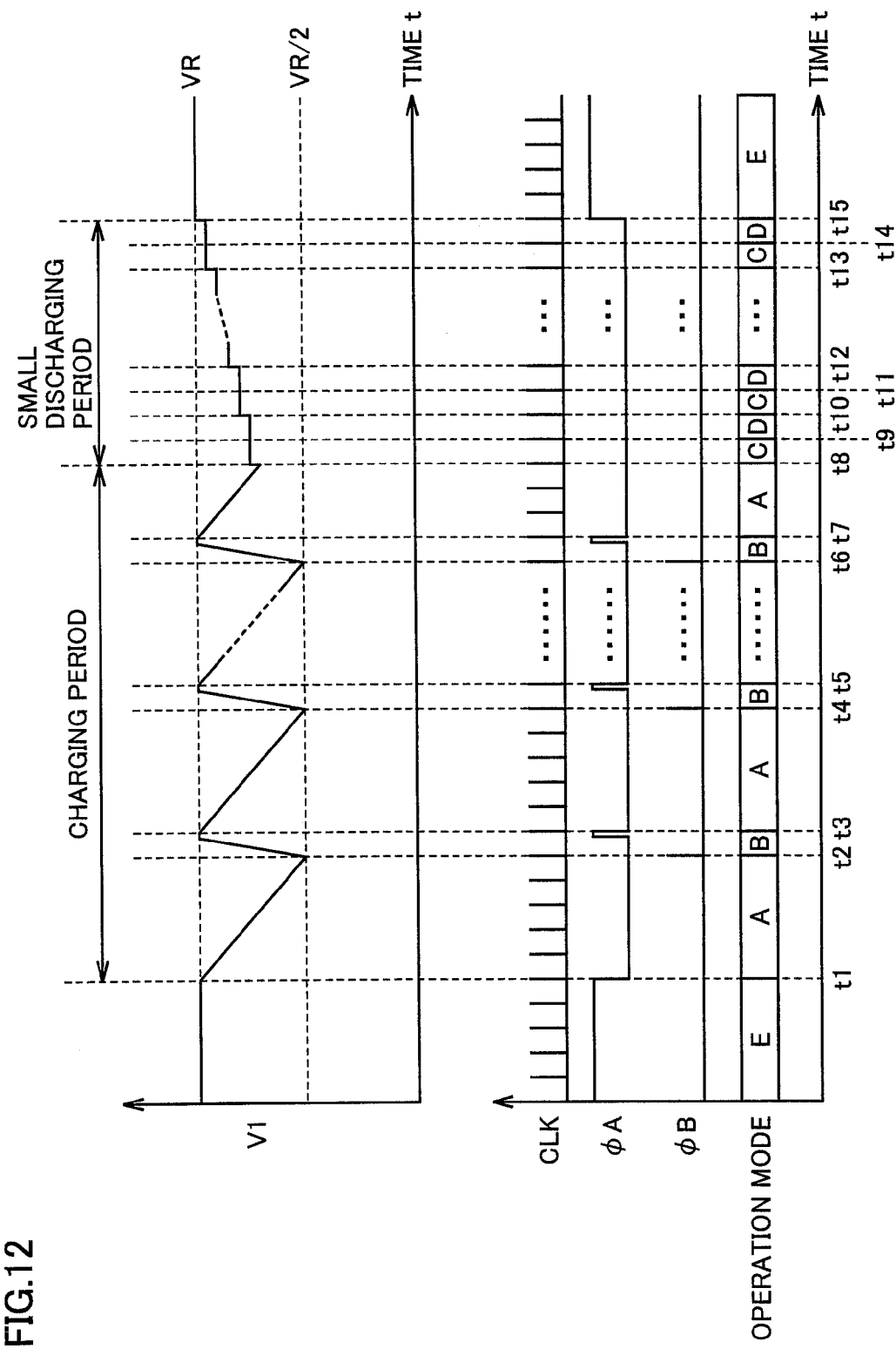
FIG. 12 is a time chart showing an operation of the charge amount detection circuit shown in FIG. 11.

FIG. 12 is a time chart showing operations of charge amount detection circuit 6 and computation control unit 7, and FIG. 13 is a view showing states of switches SW in operation modes A to E.

Firstly, during a period in which the illuminance sensor is stopped, switches SW are set to operation mode E (a stop mode) by computation control unit 7. In operation mode E, as shown in FIG. 13, switches SW2, SW4a, SW4b, SW6a, SW6b are on, and remaining switches SW1, SW3a, SW3b, SW5a, SW5b are off. Thereby, the voltage across the terminals of each of capacitors 22, 24, 26 is reset to 0 V, and output voltage V1 of operational amplifier 21 becomes equal to reference voltage VR.

Next, when measurement command signal φS is externally supplied, switches SW are set to operation mode A (a charging mode for capacitor 22) (a time point t1), In operation mode A, as shown in FIG. 13, switches SW1, SW4a, SW4b, SW6a, SW6b are on, and remaining switches SW2, SW3a, SW3b, SW5a, SW5b are off. Thereby, the output current of photoelectric converter 1 flows into capacitor 22 to start charging capacitor 22. In addition, output voltage V1 of operational amplifier 21 gradually decreases, and output signal φA of comparison circuit 27 falls to an "L" level.

As the charging of capacitor 22 proceeds and output voltage V1 of operational amplifier 21 reaches reference voltage VR/2, output signal φB of comparison circuit 28 rises from an "L" level to an "H" level (a time point t2). Computation control unit 7 sets switches SW to operation mode B (a large discharging mode for capacitor 22) in response to a rising edge of signal φB. In operation mode B, as shown in FIG. 13, switches SW1, SW3a, SW3b, SW6a, SW6b are on, and remaining switches SW2, SW4a, SW4b, SW5a, SW5b are off.

Thereby, all charges accumulated in capacitor 22 are transferred to capacitor 24, the voltage across the terminals of capacitor 22 is set to 0 V, and output voltage V1 of operational amplifier 21 increases to reference voltage VR. In addition, output signal φB of comparison circuit 28 falls from an "H" level to an "L" level, and output signal φA of comparison circuit 27 rises from an "L" level to an "H" level. Further, computation control unit 7 counts the number of rising edges of signal φB every time when signal φB rises from an "L" level to an "H" level.

After large discharging of capacitor 22 is started, computation control unit 7 sets switches SW to operation mode A again in response to a next rising edge of clock signal CLK (a time point t3). Thereby, output voltage V1 of operational amplifier 21 stops increasing and starts decreasing again. Further, in operation mode A, capacitor 24 is discharged concurrently with the charging of capacitor 22. Thereafter, the charges accumulated in capacitor 22 are discharged using discharging circuit 23 every time when output voltage V1 of operational amplifier 21 reaches reference voltage VR/2.

When a predetermined time has passed since the start of the charging of capacitor 22, computation control unit 7 sets switches SW to operation mode C (a small discharging mode for capacitor 22) (a time point t8). In operation mode C, as shown in FIG. 13, switches SW4a, SW4b, SW5a, SW5b are on, and remaining switches SW1, SW2, SW3a, SW3b, SW6a, SW6b are off. Thereby, the charging of capacitor 22 is stopped, and a portion of the charges accumulated in capacitor 22 is transferred to capacitor 26. The charge amount transferred from capacitor 22 to capacitor 26 on this occasion is one sixty-fourth the charge amount in capacitor 22 obtained when capacitor 22 is charged to reference voltage VR/2.

After small discharging of capacitor 22 is started, computation control unit 7 sets switches SW to operation mode D (a discharging mode for capacitor 26) in response to a next rising edge of clock signal CLK (a time point t9). In operation mode D, as shown in FIG. 13, switches SW4a, SW4b, SW6a, SW6b are on, and remaining switches SW1, SW2, SW3a, SW3b, SW5a, SW5b are off. Thereby, a charge transfer path from capacitor 22 to capacitor 26 is blocked, and capacitor 26 is discharged. Thereafter, stepwise small discharging by a predetermined amount is repeatedly performed using discharging circuit 25 until no charge remains in capacitor 22.

It is to be noted that, since one clock period is required to transfer the charges from capacitor 22 to capacitor 26, and one clock period is required to eliminate the charges in capacitor 26, a small discharging period for capacitor 22 can be a maximum of 128 clock periods.

As the small discharging of capacitor 22 proceeds and output voltage V1 of operational amplifier 21 reaches reference voltage VR, output signal φA of comparison circuit 27 rises from an "L" level to an "H" level. Computation control unit 7 sets switches SW to operation mode E in response to a rising edge of signal φA. Thereby, a series of charging/discharging operations is completed.

Further, computation control unit 7 counts a number N in which small discharging is performed using discharging circuit 25 (i.e., the number of shifts to operation mode C). In addition, computation control unit 7 obtains illuminance at a location where photoelectric converter 1 is installed based on a number M as the number of rising edges of signal φB and number N in which small discharging is performed using discharging circuit 25, and outputs digital signal DO indicating the obtained illuminance.

Figure 14:
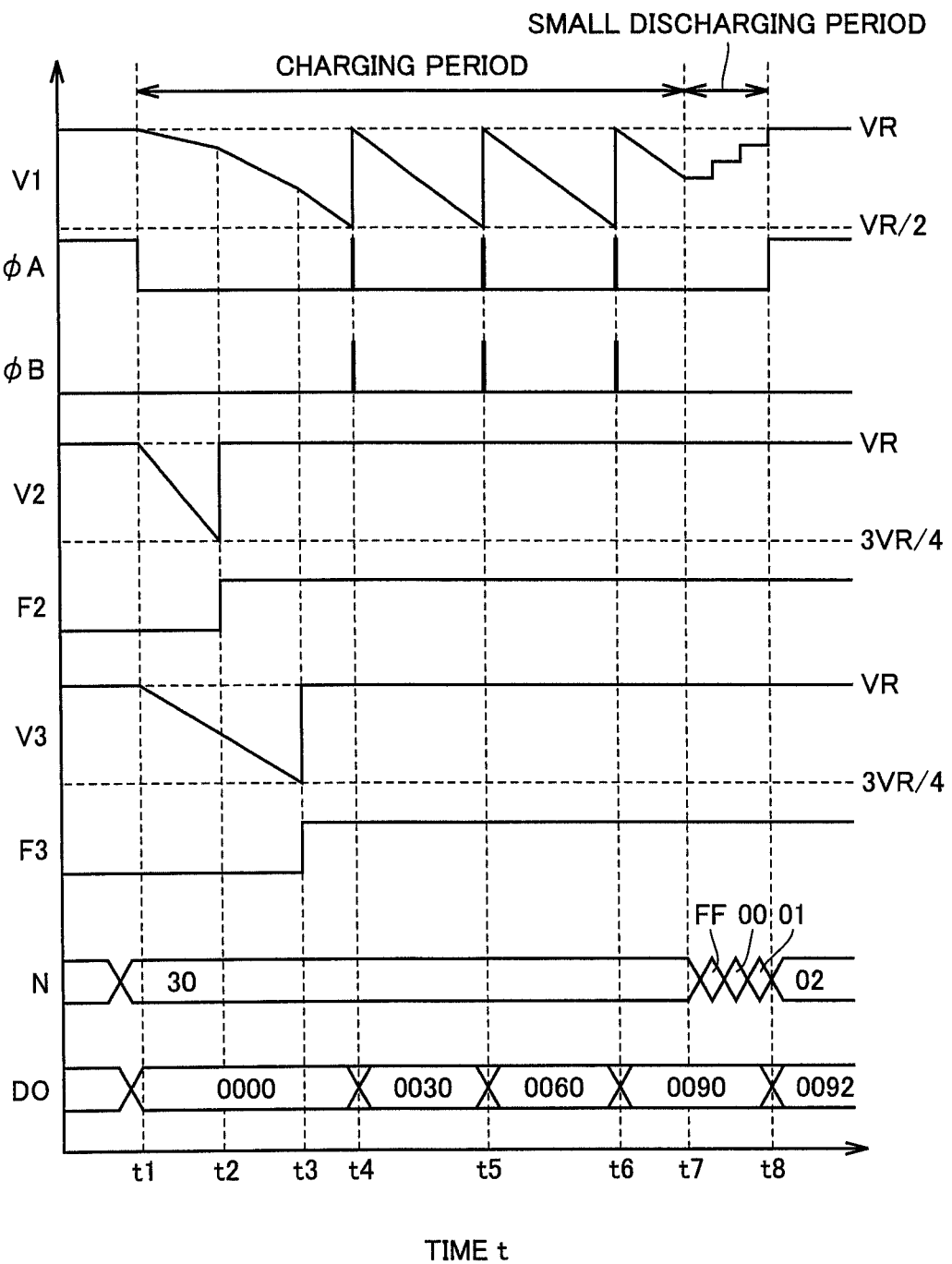
FIG. 14 is a time chart illustrating an operation of the illuminance sensor shown in FIGS. 1 to 13.

FIG. 14 is a time chart showing an operation of the illuminance sensor when the light source is a fluorescent lamp. At time point t1, charging of capacitors 22, 11, 16 is started, output voltages V1, V2, V3 of operational amplifiers 21, 10, 15 start decreasing from reference voltage VR, and output signal φA of comparison circuit 27 falls from an "H" level to an "L" level.

At time point t2, output voltage V2 of operational amplifier 10 reaches reference voltage 3VR/4, output signal φ4 of comparison circuit 13 attains an "L" level, and signal F2 rises from an "L" level to an "H" level. When signal F2 attains an "H" level, switch 12 is turned on, and output voltage V2 of operational amplifier 10 becomes equal to reference voltage VR. In addition, signal φ2 attains an "H" level in response to a rising edge of signal φ4, and thus conduction is established between terminals 2b and 2c of switch 2, and output node N2 of photosensor PS2 is connected to input node 6a of charge amount detection circuit 6. Thereby, the speed at which voltage V1 decreases is increased.

Next, at time point t3, output voltage V3 of operational amplifier 15 reaches reference voltage 3VR/4, output signal φ5 of comparison circuit 18 attains an "L" level, and signal F3 rises from an "L" level to an "H" level. When signal F3 attains an "H" level, switch 17 is turned on, and output voltage V3 of operational amplifier 15 becomes equal to reference voltage VR. In addition, signal φ3 attains an "H" level in response to a rising edge of signal φ5, and thus conduction is established between terminals 3b and 3c of switch 3, and output node N3 of photosensor PS3 is connected to input node 6a of charge amount detection circuit 6. Thereby, the speed at which voltage V1 decreases is further increased.

Subsequently, at a time point t4, when output voltage V1 of operational amplifier 21 reaches reference voltage VR/2, output signal φB of comparison circuit 28 rises from an "L" level to an "H" level. Switches SW are set to operation mode B in response to a rising edge of signal φB, all charges accumulated in capacitor 22 are transferred to capacitor 24, the voltage across the terminals of capacitor 22 is set to 0 V, and output voltage V1 of operational amplifier 21 increases to reference voltage VR. In addition, output signal φB of comparison circuit 28 falls from an "H" level to an "L" level, and output signal φA of comparison circuit 27 rises from an "L" level to an "H" level. Further, computation control unit 7 counts the number of rising edges of signal φB every time when signal φB rises from an "L" level to an "H" level. One rising edge of signal φB is equivalent to 30 Lx.

In response to a rising edge of output signal φA of comparison circuit 27, switches SW are set to operation mode A again, output voltage V1 of operational amplifier 21 starts decreasing again, and signal φA falls to an "L" level. Thereafter, the charges accumulated in capacitor 22 are discharged using discharging circuit 23 every time when output voltage V1 of operational amplifier 21 reaches reference voltage VR/2 (time points t5, t6).

Next, at a time point t7, when a charging period is terminated, switches SW are set to operation mode C, the charging of capacitor 22 is stopped, and a portion of the charges accumulated in capacitor 22 is transferred to capacitor 26. The charge amount transferred from capacitor 22 to capacitor 26 on this occasion is one sixty-fourth the charge amount in capacitor 22 obtained when capacitor 22 is charged to reference voltage VR/2.

After the small discharging of capacitor 22 is started, switches SW are set to operation mode D in response to a next rising edge of clock signal CLK, the charge transfer path from capacitor 22 to capacitor 26 is blocked, and capacitor 26 is discharged. Thereafter, stepwise small discharging by a predetermined amount is repeatedly performed using discharging circuit 25 until no charge remains in capacitor 22.

Subsequently, at time point t8, when output voltage V1 of operational amplifier 21 reaches reference voltage VR, output signal φA of comparison circuit 27 rises from an "L" level to an "H" level, and switches SW are set to operation mode E. Thereby, a series of charging/discharging operations is completed.

Further, computation control unit 7 counts number N in which small discharging is performed using discharging circuit 25, obtains illuminance at a location where photoelectric converter 1 is installed based on number M of rising edges of signal φB and number N in which small discharging is performed using discharging circuit 25, and outputs digital signal DO indicating the obtained illuminance.

Figure 15:
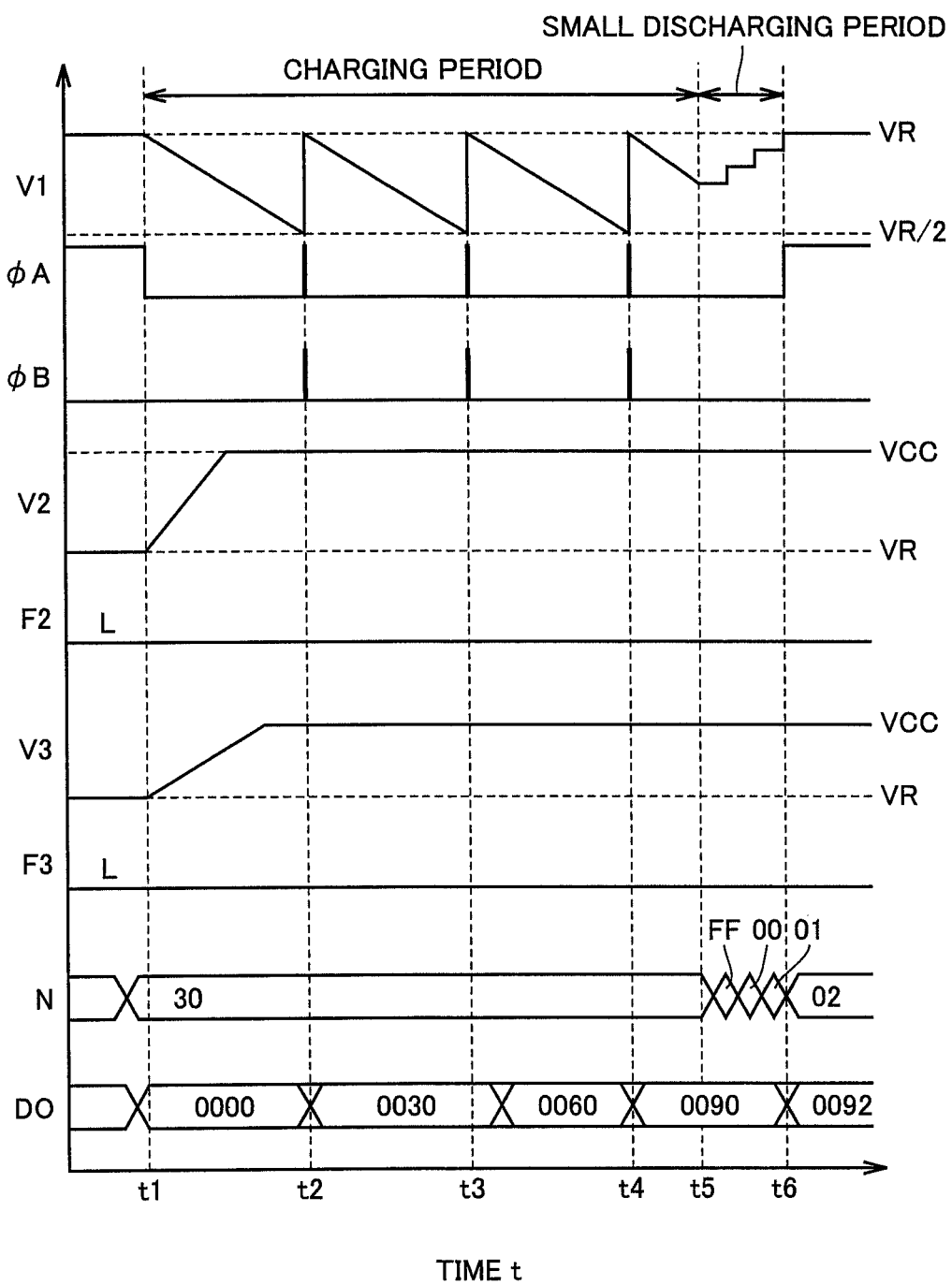
FIG. 15 is a time chart illustrating another operation of the illuminance sensor shown in FIGS. 1 to 13.

FIG. 15 is a time chart showing an operation of the illuminance sensor when the light source is an incandescent lamp, which is compared with FIG. 14. When the light source is an incandescent lamp, the output currents of photosensors PS2, PS3 have negative polarity as shown in FIGS. 6 and 7, and thus output voltages V2, V3 of operational amplifiers 10, 15 increase from reference voltage VR to power supply voltage VCC. Therefore, output signals φ4, φ5 of comparison circuits 13, 14 remain at an "H" level, signals F2, F3 remain at an "L" level, photosensors PS2, PS3 are not connected to charge amount detection circuit 6, and only photosensor PS1 is connected to charge amount detection circuit 6. Since other operations are identical to those when the light source is a fluorescent lamp, the description thereof will not be repeated.

When the light source is a white LED, the output currents of three photosensors PS1 to PS3 have positive polarity as shown in FIGS. 5 to 7, and thus three photosensors PS1 to PS3 are connected to charge amount detection circuit 6. Further, when the light source is a halogen lamp, only the output currents of two photosensors PS1, PS2 have positive polarity as shown in FIGS. 5 to 7, and thus only two photosensors PS1, PS2 are connected to charge amount detection circuit 6.

In Embodiment 1, photoelectric converter 1 is configured with three photosensors PS1 to PS3, and the sum of positive currents among the output currents of three photosensors PS1 to PS3 is set to be constant for a given illuminance, regardless of the type of light source. Therefore, illuminance can be accurately detected regardless of the type of light source.

Further, since charge amount detection circuit 6 common to three photosensors PS1 to PS3 is provided, a smaller circuit size can be achieved when compared with a case where charge amount detection circuit 6 is provided to each of three photosensors PS1 to PS3.

Although the charges in capacitor 22 are transferred to capacitor 26 little by little after the charging period is terminated in Embodiment 1, the charges in capacitor 22 may be discharged via a constant current circuit after the charging period is terminated. In this case, the charge amount in capacitor 22 can be obtained based on a constant current flowing through the constant current circuit and time taken to discharge all charges in capacitor 22.

Figure 16:
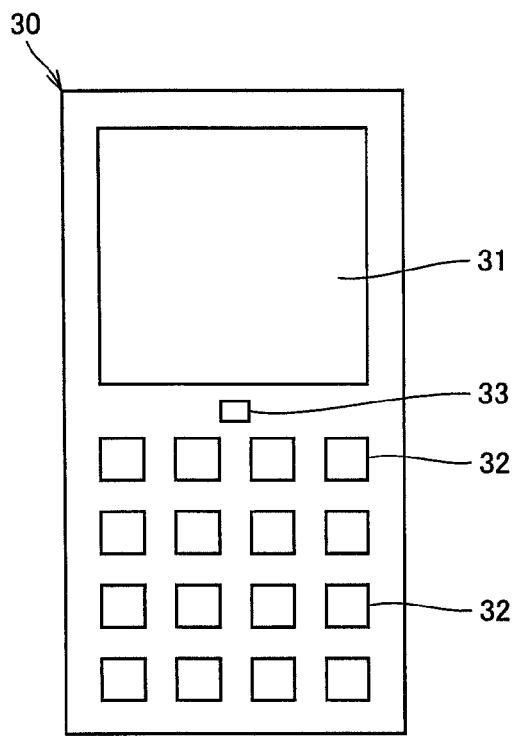
FIG. 16 is a view showing a mobile phone provided with the illuminance sensor shown in FIGS. 1 to 15.
Figure 17:
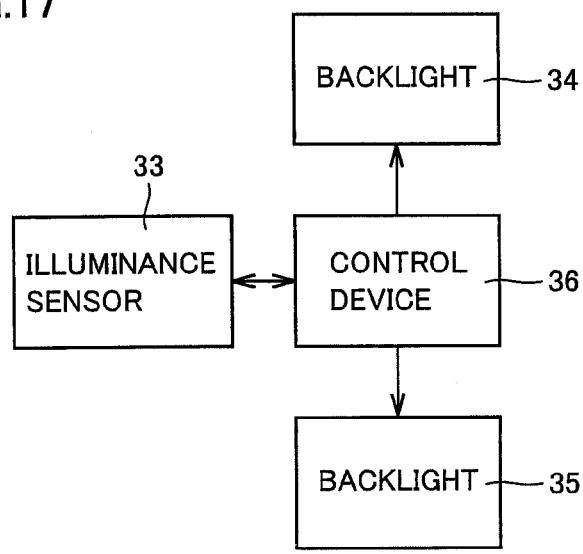
FIG. 17 is a block diagram showing portions related to the illuminance sensor in the mobile phone shown in FIG. 16.

FIG. 16 is a view showing a mobile phone 30 provided with the illuminance sensor shown in FIGS. 1 to 15. In FIG. 16, a surface of mobile phone 30 is provided with a liquid crystal panel 31 displaying an image, a plurality of keypads 32 for inputting numerals and the like, and an illuminance sensor 33 implemented as an integrated circuit. Illuminance sensor 33 is the one shown in FIGS. 1 to 15. Further, as shown in FIG. 17, mobile phone 30 includes therein a backlight 34 for supplying transmitting light to liquid crystal panel 31, a backlight 35 for supplying transmitting light to the plurality of keypads 32, and a control device 36 controlling brightness of each of backlights 34, 35 based on a detection result of illuminance sensor 33.

As illuminance increases, control device 36 increases brightness of backlight 34 for liquid crystal panel 31. In addition, control device 36 lights up backlight 35 for keypads 32 in the case of low illuminance, and lights out backlight 35 for keypads 32 in the case of high illuminance. Thereby, visibility of liquid crystal panel 31 and keypads 32 can be improved, and power consumption can be reduced.

It is to be noted that illuminance sensor 33 is not limited to mobile phone 30, and can be applied to various electrical equipment provided with a liquid crystal panel and a backlight (such as a liquid crystal television, a personal computer, and the like). Further, illuminance sensor 33 can be mounted to a digital still camera or a digital video camera and used to measure illuminance at a shooting location.

Embodiment 2

In the illuminance sensor of Patent Document 1, the charging period for the capacitor is fixed to a given period, and thus it is not possible to detect illuminance in a wide range from a bright state to a dark state with a high resolution.

Therefore, a main object of Embodiment 2 is to provide an illuminance sensor capable of detecting a wide range of illuminance with a high resolution.

Figure 18:
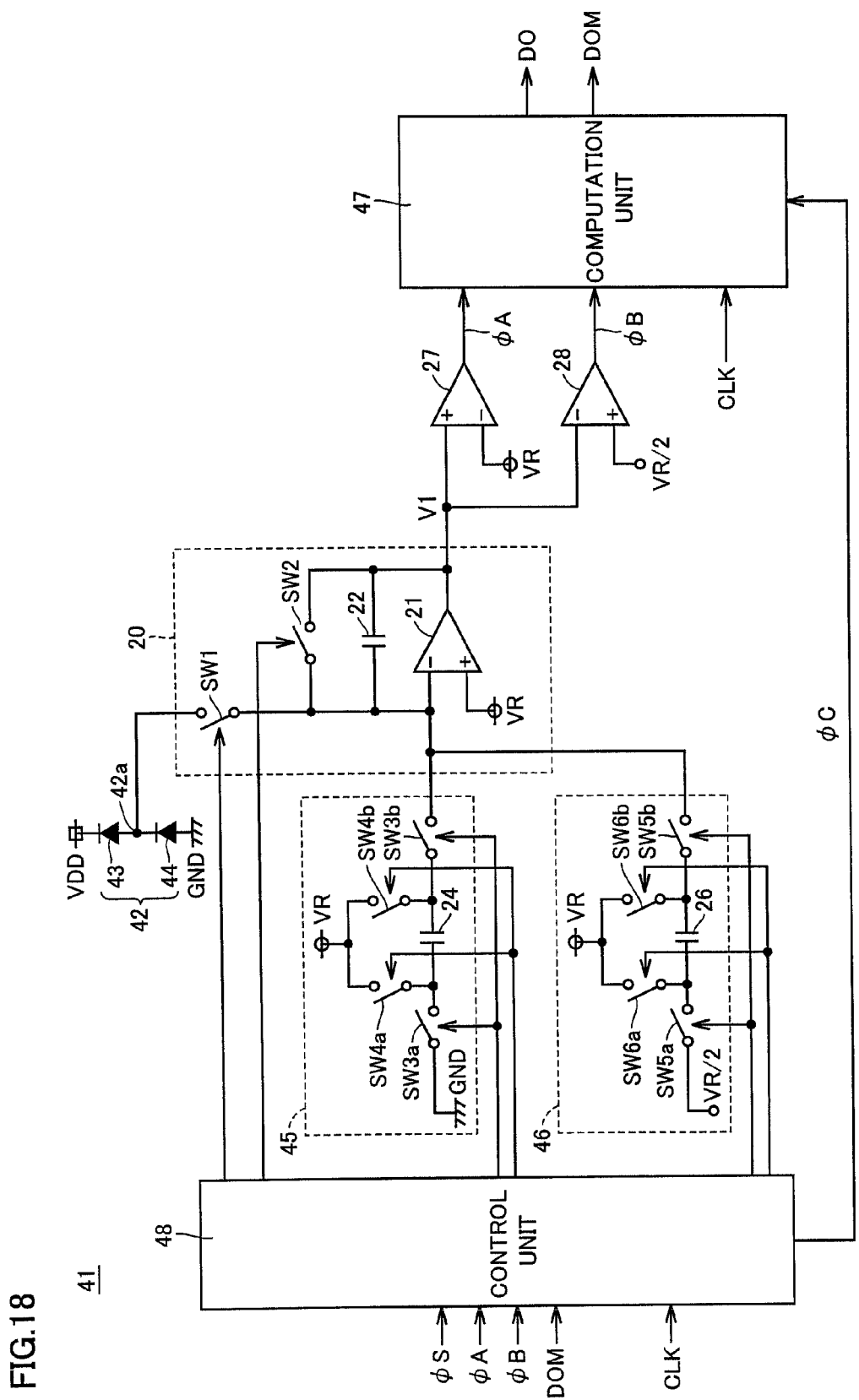
FIG. 18 is a block diagram showing a configuration of an illuminance sensor in accordance with Embodiment 2 of the present invention.

FIG. 18 is a block diagram showing a configuration of an illuminance sensor 41 in accordance with Embodiment 2. In FIG. 18, illuminance sensor 41 includes a photosensor 42, integration circuit 20, discharging circuits 45, 46, comparison circuits 27, 28, a computation unit 47, and a control unit 48. Photosensor 42 includes photodiodes 43, 44. Photodiode 43 has a cathode receiving a power supply voltage VDD, and an anode connected to an output node 42a. Photodiode 44 has a cathode connected to output node 42a, and an anode receiving ground voltage GND.

Photodiode 43 has light sensitivity to visible light and infrared radiation, and causes a current at a level in accordance with light intensity of incident light to flow. Photodiode 44 has light sensitivity to infrared radiation, and causes a current at a level in accordance with light intensity of incident light to flow. Accordingly, when light including visible light and infrared radiation is incident on photodiodes 43, 44, a current as a difference between the current flowing through photodiode 43 and the current flowing through photodiode 44 flows out from output node 42a. Therefore, photosensor 42 has sensitivity similar to that of the human eye, and outputs a current at a level in accordance with light intensity of incident visible light.

Since configurations and operations of integration circuit 20 and comparison circuits 27, 28 are identical to those shown in FIG. 11, the description thereof will not be repeated. Switch SW1 in integration circuit 20 is connected between output node 42a of photosensor 42 and the inverting input terminal of operational amplifier 21.

In discharging circuit 23 in FIG. 11, one terminals of switches SW4a, SW4b receive ground voltage GND, whereas in discharging circuit 45 in FIG. 18, one terminals of switches SW4a, SW4b receive reference voltage VR, and they are different in this regard. However, they are identical in that the voltage across the terminals of capacitor 24 is reset to 0 V when switches SW4a, SW4b are turned on, and operations of discharging circuits 23 and 45 are identical.

In addition, in discharging circuit 25 in FIG. 11, one terminals of switches SW6a, SW6b receive reference voltage VR/2, whereas in discharging circuit 46 in FIG. 18, one terminals of switches SW6a, SW6b receive reference voltage VR, and they are different in this regard. However, they are identical in that the voltage across the terminals of capacitor 26 is reset to 0 V when switches SW6a, SW6b are turned on, and operations of discharging circuits 25 and 46 are identical.

Computation unit 47 operates in synchronization with clock signal CLK, and outputs a digital signal DOM indicating a monitor value of illuminance and digital signal DO indicating the illuminance, based on a charging signal φC indicating a charging period for capacitor 22 and output signals φA, φB of comparison circuits 27, 28. In addition, computation unit 47 counts the number of pulses of clock signal CLK to measure time.

Specifically, every time when signal φB rises from an "L" level to an "H" level, computation unit 47 counts the number of rising edges of signal φB, obtains the monitor value of the illuminance based on the counted value, and outputs digital signal DOM indicating the obtained monitor value. If the number of rising edges of signal φB is m (where m is a natural number), the monitor value of the illuminance is set to m×64 (Lx).

Further, after charging of capacitor 22 is terminated, computation unit 47 obtains a charging time TC for capacitor 22 and number M of rising edges of signal φB within charging time TC (where M is a natural number). Illuminance obtained from the charge amount in capacitor 22 in charging time TC is M×64 (Lx). Furthermore, computation unit 47 counts the number of pulses of clock signal CLK from when the charging of capacitor 22 is terminated to when discharging of capacitor 22 by discharging circuit 46 is terminated. If the counted number of pulses of clock signal CLK is N (where N is a natural number), illuminance obtained from the charge amount in capacitor 22 after termination of charging time TC is N/2 (Lx). Further, computation unit 47 obtains illuminance at a location where photosensor 42 is installed by adding the illuminance M×64 (Lx) obtained from the charge amount in capacitor 22 in charging time TC and the illuminance N/2 (Lx) obtained from the charge amount in capacitor 22 after the termination of charging time TC, and outputs digital signal DO indicating the obtained illuminance.

Control unit 48 operates in synchronization with clock signal CLK, causes charging signal φC to rise to an "H" level in response to externally supplied measurement command signal φS, and thereafter controls switches SW1, SW2, SW3a, SW3b, SW4a, SW4b based on the output signals of comparison circuits 27, 28 to charge/discharge capacitor 22. In addition, control unit 48 counts the number of pulses of clock signal CLK to measure time.

Further, control unit 48 determines whether or not the monitor value m×64 (Lx) of the illuminance indicated by digital signal DOM exceeds a predetermined value L1 after a predetermined time T1 has passed since charging signal φC rose to an "H" level. If the monitor value m×64 (Lx) of the illuminance exceeds predetermined value L1, control unit 48 causes charging signal φC to fall to an "L" level, stops the charging of capacitor 22, and controls switches SW5a, SW5b, SW6a, SW6b to discharge the charges in capacitor 22 little by little. Control unit 48 terminates the discharging of capacitor 22 in response to signal φA rising to an "H" level.

If the monitor value m×64 (Lx) of the illuminance does not exceed predetermined value L1, control unit 48 determines whether or not the monitor value m×64 (Lx) of the illuminance exceeds a predetermined value L2 after a predetermined time T2 (>T1) has passed since the start of the charging of capacitor 22, If the monitor value m×64 (Lx) of the illuminance exceeds predetermined value L2, control unit 48 causes charging signal φC to fall to an "L" level, stops the charging of capacitor 22, and controls switches SW5a, SW5b, SW6a, SW6b to discharge the charges in capacitor 22 little by little. Control unit 48 terminates the discharging of capacitor 22 in response to signal φA rising to an "H" level.

Further, if the monitor value m×64 (Lx) of the illuminance does not exceed predetermined value L2, control unit 48 causes charging signal φC to fall to an "L" level after a predetermined time T3 (>T2) has passed since the start of the charging of capacitor 22, stops the charging of capacitor 22, and controls switches SW5a, SW5b, SW6a, SW6b to discharge the charges in capacitor 22 little by little. Control unit 48 terminates the discharging of capacitor 22 in response to signal φA rising to an "H" level.

Figure 19:
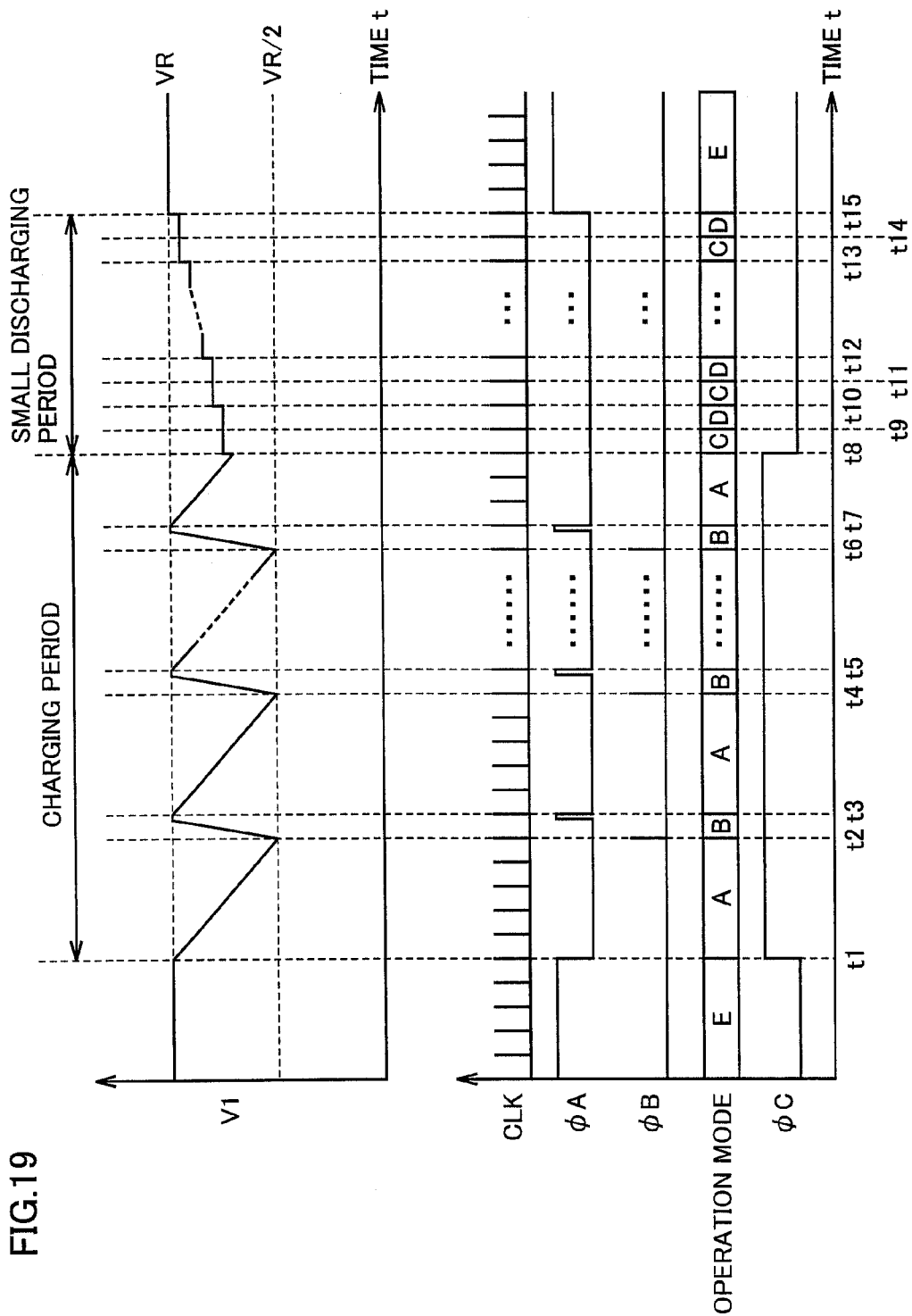
FIG. 19 is a time chart showing an operation of the illuminance sensor shown in FIG. 18.

FIG. 19 is a time chart showing an operation of illuminance sensor 41 shown in FIG. 18. Firstly, during a period in which illuminance sensor 41 is stopped, switches SW are set to operation mode E (the stop mode) by control unit 48. In operation mode E, the voltage across the terminals of each of capacitors 22, 24, 26 is reset to 0 V, and output voltage V1 of operational amplifier 21 becomes equal to reference voltage VR.

Next, when measurement command signal φS is externally supplied, charging signal φC rises to an "H" level, and switches SW are set to operation mode A (the charging mode for capacitor 22) (time point t1). In operation mode A, the output current of photosensor 42 flows into capacitor 22 to start charging capacitor 22. In addition, output voltage V1 of operational amplifier 21 gradually decreases, and output signal φA of comparison circuit 27 falls to an "L" level.

As the charging of capacitor 22 proceeds and output voltage V1 of operational amplifier 21 reaches reference voltage VR/2, output signal φB of comparison circuit 28 rises from an "L" level to an "H" level (time point t2). Control unit 48 sets switches SW to operation mode B (the large discharging mode for capacitor 22) in response to a rising edge of signal φ3.

In operation mode B, all charges accumulated in capacitor 22 are transferred to capacitor 24, the voltage across the terminals of capacitor 22 is set to 0 V, and output voltage V1 of operational amplifier 21 increases to reference voltage VR. In addition, output signal φB of comparison circuit 28 falls from an "H" level to an "L" level, and output signal φA of comparison circuit 27 rises from an "L" level to an "H" level. Further, computation unit 47 counts the number of rising edges of signal φB every time when signal φB rises from an "L" level to an "H" level, obtains the monitor value m×64 (Lx) of the illuminance based on the counted value m, and outputs digital signal DOM indicating the obtained monitor value m×64 (Lx).

After large discharging of capacitor 22 is started, control unit 48 sets switches SW to operation mode A again in response to a next rising edge of clock signal CLK (time point t3). Thereby, output voltage V1 of operational amplifier 21 stops increasing and starts decreasing again. Further, in operation mode A, capacitor 24 is discharged concurrently with the charging of capacitor 22. Thereafter, the charges accumulated in capacitor 22 are discharged using discharging circuit 45 every time when output voltage V1 of operational amplifier 21 reaches reference voltage VR/2.

If the monitor value m×64 (Lx) of the illuminance indicated by digital signal DOM exceeds predetermined value L1 when predetermined time T1 has passed since the start of the charging of capacitor 22, if the monitor value m×64 (Lx) of the illuminance exceeds predetermined value L2 when predetermined time T2 (>T1) has passed since the start of the charging of capacitor 22, or if predetermined time T3 (>T2) has passed since the start of the charging of capacitor 22, control unit 48 causes charging signal φC to fall to an "L" level, and sets switches SW to operation mode C (the small discharging mode for capacitor 22) (time point t8).

In operation mode C, the charging of capacitor 22 is stopped, and a portion of the charges accumulated in capacitor 22 is transferred to capacitor 26. The charge amount transferred from capacitor 22 to capacitor 26 on this occasion is one sixty-fourth the charge amount in capacitor 22 obtained when capacitor 22 is charged to reference voltage VR/2.

After small discharging of capacitor 22 is started, control unit 48 sets switches SW to operation mode D (a discharging mode for capacitor 11) in response to a next rising edge of clock signal CLK (time point t9). In operation mode D, the charge transfer path from capacitor 22 to capacitor 26 is blocked, and capacitor 26 is discharged. Thereafter, stepwise small discharging by a predetermined amount is repeatedly performed using discharging circuit 46 until no charge remains in capacitor 22.

It is to be noted that, since one clock period is required to transfer the charges from capacitor 22 to capacitor 26, and one clock period is required to eliminate the charges in capacitor 26, a small discharging period for capacitor 22 can be a maximum of 128 clock periods.

As the small discharging of capacitor 22 proceeds and output voltage V1 of operational amplifier 21 reaches reference voltage VR, output signal φA of comparison circuit 27 rises from an "L" level to an "H" level. Control unit 48 sets switches SW to operation mode E in response to a rising edge of signal φA. Thereby, a series of charging/discharging operations is completed.

On the other hand, computation unit 47 counts number N in which small discharging is performed using discharging circuit 46 (i.e., the number of shifts to operation mode C). In addition, computation unit 47 obtains charging time TC for capacitor 22 and number M of rising edges of signal φB within charging time TC. Further, computation unit 47 obtains illuminance at the location where photosensor 42 is installed based on charging time TC for capacitor 22, number M of rising edges of signal φB within charging time TC, and number N in which small discharging is performed using discharging circuit 46, and outputs digital signal DO indicating the obtained illuminance.

For example, if charging time TC for capacitor 22 is a predetermined time Ta, the illuminance is M×64+N/2 (Lx). If the charging of capacitor 22 is terminated in a time Tb shorter than predetermined time Ta because the monitor value m×64 (Lx) of the illuminance is greater than a predetermined value, the illuminance is (M×64+N/2)×Ta/Tb (Lx).

Since charging time TC for capacitor 22 is conventionally fixed to predetermined time Ta, when illuminance is high, M×64 is much greater than N/2, and the illuminance is approximately M×64, leading to low resolution of a measured value. In contrast, in the present invention, when illuminance is high, the charging of capacitor 22 is terminated in shorter time Tb. This can prevent M×64 from being much greater than N/2, and enhance resolution of a measured value. Further, when illuminance is high, the charging time for capacitor 22 is reduced, and when illuminance is low, the charging time for capacitor 22 is increased. Therefore, a wide range of illuminance can be measured.

Figure 20:
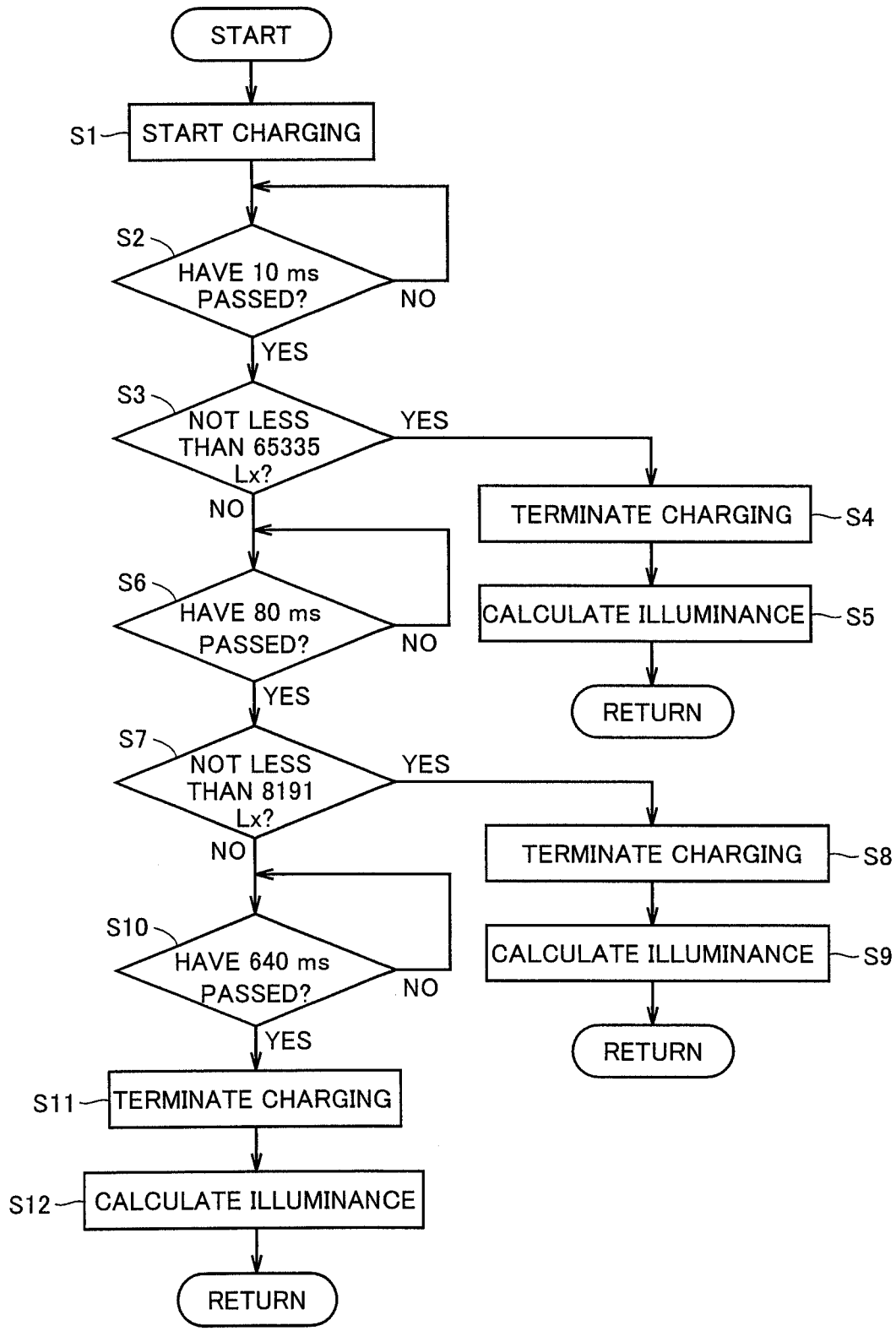
FIG. 20 is a view showing a flowchart illustrating the operation of the illuminance sensor shown in FIG. 18.

FIG. 20 is a view showing a flowchart showing an operation of computation unit 47 and control unit 48. In step S1, control unit 48 starts charging capacitor 22 in response to measurement command signal φS. Every time when the voltage across the terminals of capacitor 22 reaches reference voltage VR/2, capacitor 22 is discharged, and the monitor value m×64 (Lx) of the illuminance is obtained by computation unit 47. Control unit 48 monitors the monitor value m×64 (Lx) of the illuminance based on digital signal DOM from computation unit 47.

In step S2, control unit 48 waits for passage of predetermined time T1 (for example, 10 ms) since the start of the charging of capacitor 22, and in step S3, control unit 48 determines whether or not the monitor value m×64 (Lx) of the illuminance is not less than predetermined value L1 (for example, 65335 Lx). If the monitor value m×64 (Lx) of the illuminance is not less than predetermined value L1, in step S4, control unit 48 terminates the charging of capacitor 22 and performs small discharging of capacitor 22. In step S5, computation unit 47 obtains the illuminance at the location where photosensor 42 is installed based on charging time TC for capacitor 22, number M of rising edges of signal φB within charging time TC, and number N in which small discharging is performed using discharging circuit 46 (i.e., the number of shifts to operation mode C), and outputs digital signal DO indicating the obtained illuminance. If the monitor value m×64 (Lx) of the illuminance is less than predetermined value L1, the operation proceeds to step S6.

In step S6, control unit 48 waits for passage of predetermined time T2 (for example, 80 ms) since the start of the charging of capacitor 22, and in step S7, control unit 48 determines whether or not the monitor value of the illuminance is not less than predetermined value L2 (for example, 8191 Lx). If the monitor value of the illuminance is not less than predetermined value L2, in step S8, control unit 48 terminates the charging of capacitor 22 and performs small discharging of capacitor 22. In step S9, computation unit 47 obtains the illuminance at the location where photosensor 42 is installed based on charging time TC for capacitor 22, number M of rising edges of signal φB within charging time TC, and number N in which small discharging is performed using discharging circuit 46 (i.e., the number of shifts to operation mode C), and outputs digital signal DO indicating the obtained illuminance. If the monitor value of the illuminance is less than predetermined value L2, the operation proceeds to step S10.

In step S10, control unit 48 waits for passage of predetermined time T3 (for example, 640 ms) since the start of the charging of capacitor 22, and in step S11, control unit 48 terminates the charging of capacitor 22 and performs small discharging of capacitor 22. In step S12, computation unit 47 obtains the illuminance at the location where photosensor 42 is installed based on charging time TC for capacitor 22, number M of rising edges of signal φB within charging time TC, and number N in which small discharging is performed using discharging circuit 46 (i.e., the number of shifts to operation mode C), and outputs digital signal DO indicating the obtained illuminance.

In Embodiment 2, the charging period is divided into three periods, and every time when the first and the second periods are terminated, the monitor value m×64 (Lx) of the illuminance is obtained based on number m in which capacitor 22 is discharged, and if the obtained monitor value m×64 (Lx) exceeds a value predetermined for the periods, the charging of capacitor 22 is terminated, and if it does not exceed the value, the charging of capacitor 22 is continued. Therefore, since the charging time for capacitor 22 is changed in accordance with the illuminance at the location where photosensor 42 is installed, a wide range of illuminance can be detected with a high resolution, when compared with a conventional case where the charging time for capacitor 22 is fixed.

Although the charges in capacitor 22 are transferred to capacitor 26 little by little after the charging period is terminated in Embodiment 2, the charges in capacitor 22 may be discharged via a constant current circuit after the charging period is terminated. In this case, the charge amount in capacitor 22 can be obtained based on a constant current flowing through the constant current circuit and time taken to discharge all charges in capacitor 22.

Embodiment 3

Figure 21:
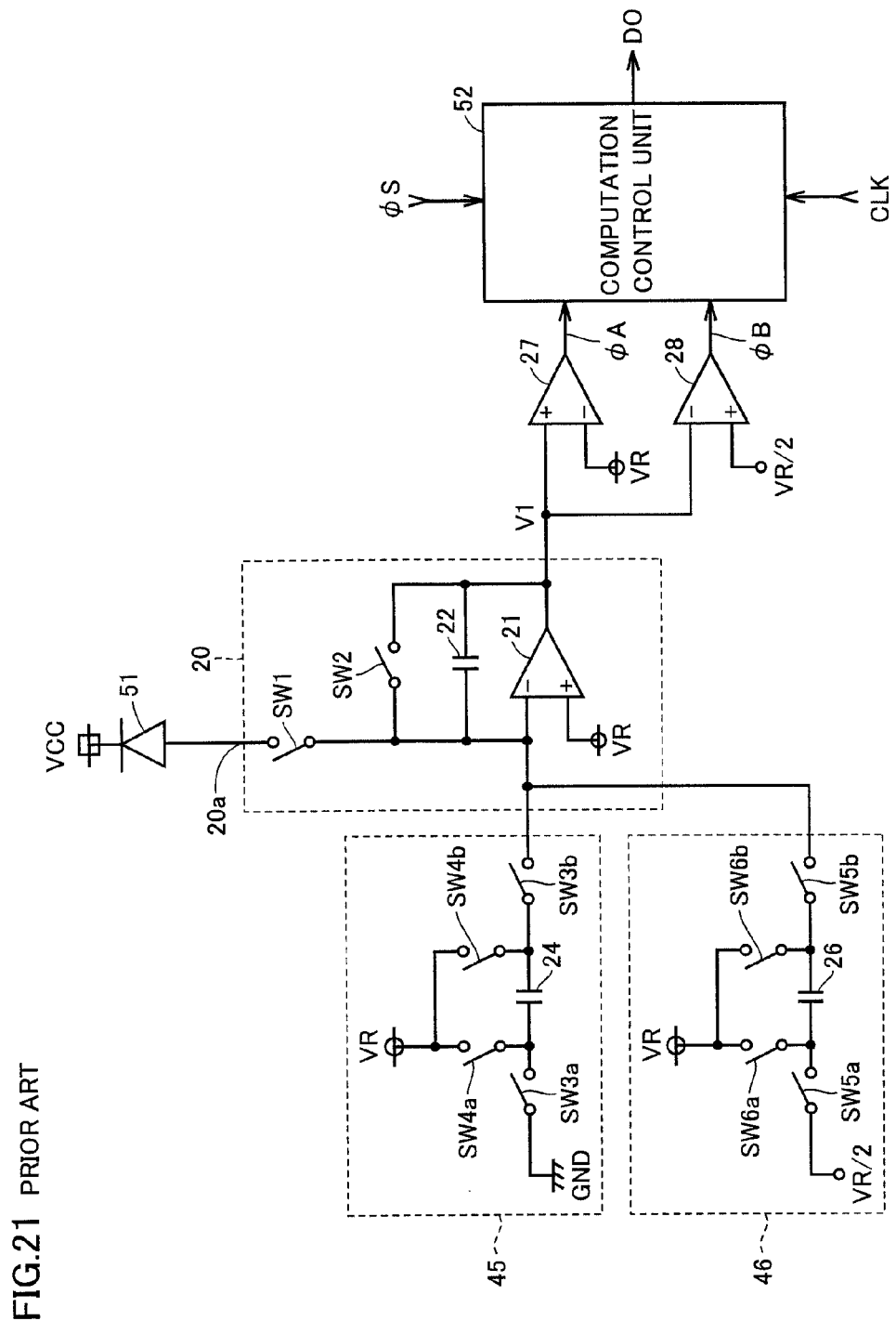
FIG. 21 is a circuit block diagram showing a configuration of a conventional illuminance sensor serving as a basis for Embodiment 3.

As shown in FIG. 21, a conventional illuminance sensor includes a photoelectric converter 51, integration circuit 20, discharging circuits 45, 46, comparison circuits 27, 28, and a computation control unit 52. Photoelectric converter 51 is connected to a node of power supply voltage VCC and an input node 20a of integration circuit 20 to cause a current at a level in accordance with illuminance to flow. Photoelectric converter 51 includes, for example, a photodiode.

Configurations and operations of integration circuit 20, discharging circuits 45, 46, and comparison circuits 27, 28 are as described in FIGS. 11, 18, and the like. In addition, computation control unit 52 operates in synchronization with clock signal CLK, controls the entire illuminance sensor in response to externally supplied measurement command signal φS, obtains illuminance based on output signals φA, φB of comparison circuits 27, 28, and outputs digital signal DO indicating the obtained illuminance.

However, the conventional illuminance sensor does not have a fully satisfactory light sensitivity. Although increasing a light receiving area of photoelectric converter 51 can be considered as a method to increase the light sensitivity of the illuminance sensor, this method results in increased device dimensions. Further, although increasing the charging period for capacitor 22 can also be considered as another method, this method results in increased measurement time. If the capacitance value of capacitor 22 is reduced, resolution of a charge amount in the above charging period is enhanced, but the resolution of the charge amount after the charging period is deteriorated. In addition, if the capacitance value of capacitor 26 is reduced to decrease a current value flowing out from capacitor 22 after the charging period, this leads to increased measurement time and increased variations in measurement results.

Therefore, a main object of Embodiment 3 is to provide an illuminance sensor that requires less measurement time, has high sensitivity, and is small-sized.

Figure 22:
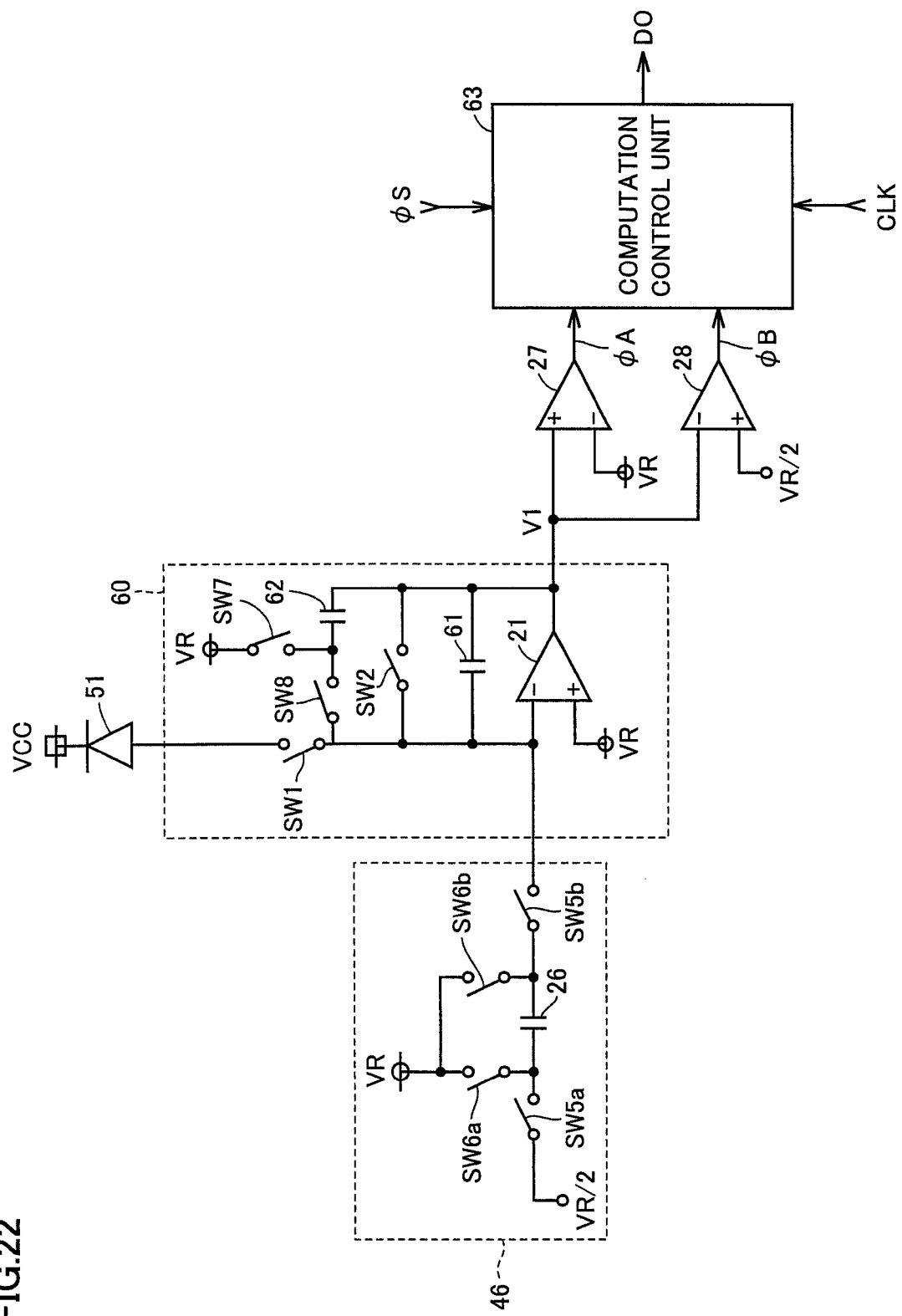
FIG. 22 is a circuit block diagram showing a configuration of an illuminance sensor in accordance with Embodiment 3 of the present invention.

FIG. 22 is a circuit block diagram showing a configuration of an illuminance sensor in accordance with Embodiment 3 of the present invention, which is compared with FIG. 21. The illuminance sensor in FIG. 22 is different from the illuminance sensor in FIG. 21 in that integration circuit 20 is replaced by an integration circuit 60, discharging circuit 45 is removed, and computation control unit 52 is replaced by a computation control unit 63.

Integration circuit 60 is different from integration circuit 20 in that capacitor 22 is replaced by capacitors 61, 62, and switches SW7, SW8 are added. Capacitor 61 is connected between the inverting input terminal and the output terminal of operational amplifier 21. A capacitance value C61 of capacitor 61 is set, for example, to 1 pF. Switch SW8 and capacitor 62 are connected in series between the inverting input terminal and the output terminal of operational amplifier 21. A capacitance value C62 of capacitor 62 is set to a value greater than capacitance value C61 of capacitor 61 (for example, 63 pF). The sum of the capacitance values of capacitors 61, 62 (C61+C62) is set, for example, to a value identical to capacitance value C22 of capacitor 22. Switch SW7 is connected between a node of reference voltage VR and a node between switch SW8 and capacitor 62.

When switches SW1, SW7 are turned off and switches SW2, SW8 are turned on, a short circuit occurs between terminals of each of capacitors 61, 62 to cause a voltage across the terminals of each of capacitors 61, 62 to be reset to 0 V, and the voltages at the inverting input terminal and the output terminal of operational amplifier 21 become equal to reference voltage VR, which is a voltage at the non-inverting input terminal (operation mode E). Next, when switches SW2, SW8 are turned off and switches SW1, SW7 are turned on, an output current of photoelectric converter 51 flows into capacitor 61 to charge capacitor 61 (operation modes A, B).

Since the capacitance value of capacitor 61 (1 pF) is set to one sixty-fourth the capacitance value of capacitor 22 (64 pF) in FIG. 21, if the output current of photoelectric converter 51

(that is, illuminance) is identical to that in the conventional case, the voltage across the terminals of capacitor 61 increases at a speed 64 times that of capacitor 22. In other words, even when the output current of photoelectric converter 51 (that is, illuminance) is one sixty-fourth that in the conventional case, the voltage across the terminals of capacitor 61 increases at a speed identical to that of capacitor 22 in FIG. 21. Therefore, the illuminance sensor has light sensitivity higher than the light sensitivity of the conventional illuminance sensor.

When the voltage across the terminals of capacitor 61 increases, output voltage V1 of operational amplifier 21 decreases. On this occasion, since one terminal of capacitor 62 receives reference voltage VR and the other terminal thereof receives output voltage V1 of operational amplifier 21, the voltage across the terminals of capacitor 62 has a value identical to that of the voltage across the terminals of capacitor 61. Subsequently, when switches SW1, SW2, SW7 are all turned off and switch SW8 is turned on, charging of capacitors 61, 62 is stopped (operation modes C, D).

Discharging circuit 46 includes capacitor 26 and switches SW5a, SW5b, SW6a, SW6b. Capacitance value C26 of capacitor 26 is set to a value that is one sixty-fourth the sum of the capacitance values of capacitors 61, 62 (C61+C62), for example, 1 pF. Switch SW5a, capacitor 26, and switch SW5b are connected in series between the node of reference voltage VR/2 and the inverting input terminal of operational amplifier 21, Switch SW6a has one terminal receiving reference voltage VR, and the other terminal connected to one terminal of capacitor 26. Switch SW6b has one terminal receiving reference voltage VR, and the other terminal connected to the other terminal of capacitor 26.

When switches SW5a, SW5b are both turned off and switches SW6a, SW6b are both turned on, one terminal and the other terminal of capacitor 26 are each charged to reference voltage VR, and the voltage across the terminals of capacitor 26 becomes 0 V (operation modes A, D, E). Next, when switches SW5a, SW5b are both turned on and switches SW6a, SW6b are both turned off, a portion of charges accumulated in capacitors 61, 62 is transferred to capacitor 26 (operation modes B, C).

It is to be noted that a charge amount (Q61+Q62) in capacitors 61, 62 before transfer is represented as Q61+Q62=(C61+C62)×VR/2. In addition, charge amount Q26 in capacitor 26 after transfer is represented as Q26=C26×VR/2=[(C61+C62)/64]×VR/2=(Q61+Q62)/64.

Operations of comparison circuits 27, 28 are as described in FIG. 11. Computation control unit 63 operates in synchronization with clock signal CLK, controls the entire illuminance sensor in response to externally supplied measurement command signal ϕS, obtains illuminance based on output signals ϕA, ϕB of comparison circuits 27, 28, and outputs digital signal DO indicating the obtained illuminance.

Figures 23, 24:
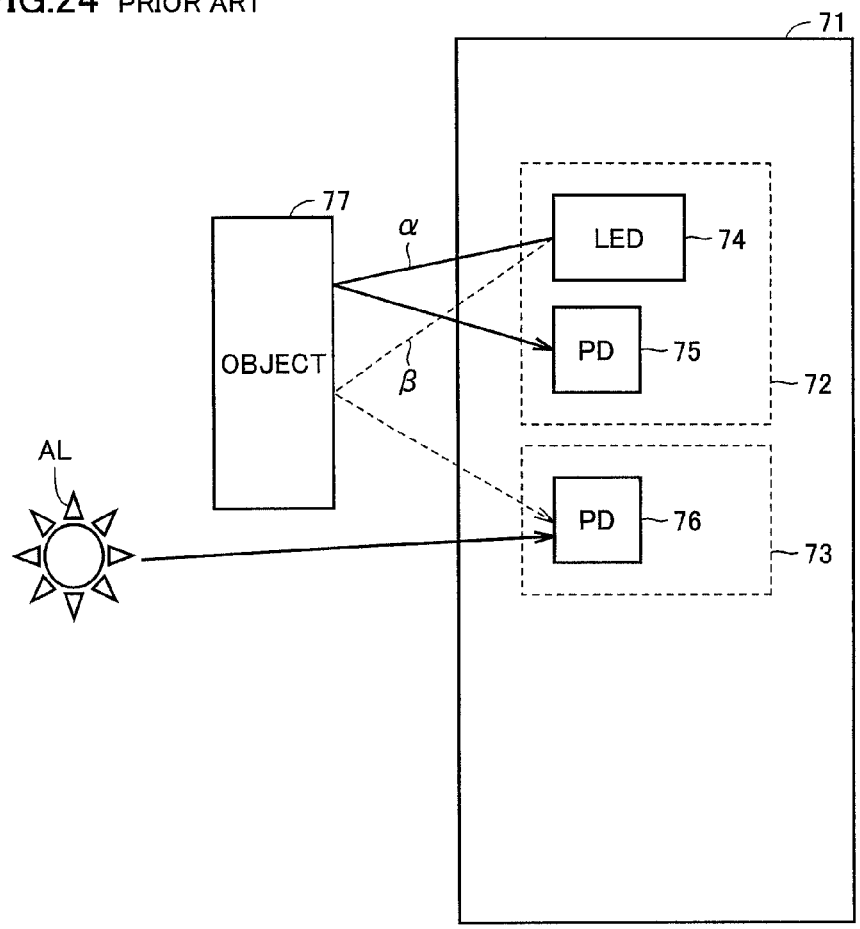
FIG. 23 is a view showing states of switches in operation modes of the illuminance sensor shown in FIG. 22.
FIG. 24 is a circuit block diagram showing a configuration of conventional electronic equipment serving as a basis for Embodiment 4.

When the output current of photoelectric converter 51 (that is, illuminance) is one sixty-fourth that in the conventional case, the operation of the illuminance sensor is identical to the operation of the illuminance sensor shown in FIG. 12. Specifically, during the period in which the illuminance sensor is stopped, switches SW are set to operation mode E (the stop mode) by computation control unit 63. In operation mode E, as shown in FIG. 23, switches SW2, SW6a, SW6b, SW8 are on, and remaining switches SW1, SW5a, SW5b, SW7 are off. Thereby, the voltage across the terminals of each of capacitors 26, 61, 62 is reset to 0 V, and output voltage V1 of operational amplifier 21 becomes equal to reference voltage VR.

Next, when measurement command signal ϕS is externally supplied, switches SW are set to operation mode A (a charging mode for capacitors 61, 62) (time point t1). In operation mode A, as shown in FIG. 23, switches SW1, SW6a, SW6b, SW7 are on, and remaining switches SW2, SW5a, SW5b, SW8 are off. Thereby, the output current of photoelectric converter 51 flows into capacitor 61 to start charging capacitor 61. Further, the voltage across the terminals of capacitor 62 has a value identical to that of the voltage across the terminals of capacitor 61. In addition, output voltage V1 of operational amplifier 21 gradually decreases, and output signal ϕA of comparison circuit 27 falls to an "L" level.

As the charging of capacitor 61 proceeds and output voltage V1 of operational amplifier 21 reaches reference voltage VR/2, output signal ϕB of comparison circuit 28 rises from an "L" level to an "H" level (time point t2). Computation control unit 63 sets switches SW to operation mode B (a large discharging mode for capacitor 61) in response to a rising edge of signal ϕB. In operation mode B, as shown in FIG. 23, switches SW1, SW5a, SW5b, SW7 are on, and remaining switches SW2, SW6a, SW6b, SW8 are off.

Thereby, all charges accumulated in capacitor 61 are transferred to capacitor 26, the voltage across the terminals of each of capacitors 61, 62 is set to 0 V, and output voltage V1 of operational amplifier 21 increases to reference voltage VR. In addition, output signal ϕB of comparison circuit 28 falls from an "H" level to an "L" level, and output signal ϕA of comparison circuit 27 rises from an "L" level to an "H" level. Further, computation control unit 63 counts the number of rising edges of signal ϕB every time when signal ϕB rises from an "L" level to an "H" level.

After large discharging of capacitor 61 is started, computation control unit 63 sets switches SW to operation mode A again in response to a next rising edge of clock signal CLK (time point t3). Thereby, output voltage V1 of operational amplifier 21 stops increasing and starts decreasing again. Further, in operation mode A, capacitor 26 is discharged concurrently with the charging of capacitor 61. Thereafter, the charges accumulated in capacitor 61 are discharged using discharging circuit 46 every time when output voltage V1 of operational amplifier 21 reaches reference voltage VR/2.

When a predetermined time has passed since the start of the charging of capacitor 61, computation control unit 63 sets switches SW to operation mode C (a small discharging mode for capacitors 61, 62) (time point t8). In operation mode C, as shown in FIG. 23, switches SW5a, SW5b, SW8 are on, and remaining switches SW1, SW2, SW6a, SW6b, SW7 are off. Thereby, the charging of capacitor 61 is stopped, and a portion of the charges accumulated in capacitors 61, 62 is transferred to capacitor 26. The charge amount transferred from capacitors 61, 62 to capacitor 26 on this occasion is one sixty-fourth the charge amount in capacitors 61, 62 obtained when capacitors 61, 62 are charged to reference voltage VR/2.

After small discharging of capacitors 61, 62 is started, computation control unit 63 sets switches SW to operation mode D (the discharging mode for capacitor 26) in response to a next rising edge of clock signal CLK (time point t9). In operation mode D, as shown in FIG. 23, switches SW6a, SW6b, SW8 are on, and remaining switches SW1, SW2, SW5a, SW5b, SW7 are off. Thereby, a charge transfer path from capacitors 61, 62 to capacitor 26 is blocked, and capacitor 26 is discharged. Thereafter, stepwise small discharging by a predetermined amount is repeatedly performed using discharging circuit 46 until no charge remains in capacitors 61, 62.

As the small discharging of capacitors 61, 62 proceeds and output voltage V1 of operational amplifier 21 reaches reference voltage VR, output signal ϕA of comparison circuit 27 rises from an "L" level to an "H" level. Computation control unit 63 sets switches SW to operation mode E in response to a rising edge of signal φA. Thereby, a series of charging/discharging operations is completed.

Further, computation control unit 63 counts number N in which small discharging is performed using discharging circuit 46 (i.e., the number of shifts to operation mode C). In addition, computation control unit 63 obtains illuminance at a location where photoelectric converter 51 is installed based on number M of rising edges of signal φB and number N in which small discharging is performed using discharging circuit 46, and outputs digital signal DO indicating the obtained illuminance.

In Embodiment 3, during the charge period, capacitor 61 is charged with the output current of photoelectric converter 51, and capacitor 61 is discharged every time when the voltage across the terminals of capacitor 61 reaches reference voltage VR/2. Further, capacitor 62 having a capacitance value greater than that of capacitor 61 is charged to a voltage identical to that of capacitor 61, and after the charging period is terminated, charges are transferred from capacitors 61, 62 to capacitor 26 at a given cycle, and illuminance is obtained based on number M in which capacitor 61 is discharged during the charge period and number N in which all charges in capacitors 61, 62 are transferred to capacitor 26. Therefore, the resolution of the charge amount during the charging period can be enhanced without lowering the resolution of the charge amount after the charging period. Consequently, an illuminance sensor that requires less measurement time, has high sensitivity, and is small-sized can be implemented.

Although the charges in capacitors 61, 62 are transferred to capacitor 26 little by little after the charging period is terminated in Embodiment 3, the charges in capacitors 61, 62 may be discharged via a constant current circuit after the charging period is terminated. In this case, the charge amount in capacitors 61, 62 can be obtained based on a constant current flowing through the constant current circuit and time taken to discharge all charges in capacitors 61, 62.

Further, although the illuminance at the location where photoelectric converter 51 is installed is obtained based on numbers M, N described above in Embodiment 3, a charge amount obtained by integrating the output current of photoelectric converter 51 may be obtained based on numbers M, N described above. In this case, the illuminance sensor operates as a charge amount detection circuit detecting the charge amount generated in photoelectric converter 51 during the charging period.

Embodiment 4

To make Embodiment 4 to be easily understood, firstly, conventional electronic equipment 71 as a basis for Embodiment 4 will be described. As shown in FIG. 24, conventional electronic equipment 71 includes a proximity sensor 72 and an illuminance sensor 73 arranged adjacent to each other. Proximity sensor 72 includes an infrared diode 74 and a photodiode 75. Illuminance sensor 73 includes a photodiode 76.

Light α emitted from infrared diode 74 is reflected by an object 77, the reflected light enters photodiode 75, and thereby proximity sensor 72 detects the presence of object 77. Illuminance sensor 73 measures ambient brightness by detecting ambient light AL with photodiode 76. For example, if light β emitted from infrared diode 74 is reflected by object 77 and the reflected light enters photodiode 76 while illuminance sensor 73 performs measurement, photodiode 76 detects ambient light AL and light β.

In a case where illuminance sensor 73 is configured such that a current output from photodiode 76 is input to an integral analog/digital converter, if light emission from infrared diode 74 in proximity sensor 72 arranged adjacent to illuminance sensor 73 causes an increase in light that enters photodiode 76 by light β, the current output from photodiode 76 is increased accordingly, and thus a current to be integrated is increased. If illuminance sensor 73 performs an integration operation in this state, illuminance sensor 73 outputs a result of measuring brightness of light combining ambient light AL and light β, rather than brightness of ambient light AL.

In order to allow illuminance sensor 73 to measure the brightness of ambient light AL accurately, illuminance sensor 73 is required to perform an operation such that illuminance sensor 73 suspends an operation of integrating the current output by photodiode 76 while light β enters photodiode 76, and resumes the integration operation after infrared diode 74 terminates light emission. In addition, the brightness of ambient light AL can also be measured by using an optical filter to cause photodiode 76 to receive visible light only.

Patent Document 1 relates to an analog/digital converter and an illuminance sensor using the same, and the like, and does not suggest using the illuminance sensor and an infrared reflective proximity sensor adjacent to each other. The illuminance sensor can suspend an operation of integrating a current input to the inside analog/digital converter if the current to be input to the analog/digital converter is blocked by a switch provided to an input unit.

However, in a case where the switch is composed of a transistor, when the switch is turned off, charges to be input to the analog/digital converter are accumulated in a parasitic capacitance of the switch itself, and when the switch is turned on thereafter, the charges accumulated in the parasitic capacitance of the switch itself are input to the analog/digital converter, affecting the integration operation. Accordingly, there arises a problem that the operation of integrating the current input to the analog/digital converter cannot be resumed after being suspended.

In Patent Document 2, it can be assumed that, if light entering the illuminance sensor is filtered by an optical filter, the illuminance sensor measures ambient brightness accurately to a certain extent. However, manufacturing cost for fabricating the optical filter is required, and using the optical filter is not suitable for reducing the size of the entire illuminance sensor.

In view of the problems described above, the inventor of the present invention has found that, in order to allow an illuminance sensor and an infrared reflective proximity sensor to be arranged adjacent to each other without using an optical filter, it is effective to use an analog/digital converter capable of temporarily suspending and resuming an operation of integrating an input current, for the illuminance sensor.

Specifically, Embodiment 4 provides an illuminance sensor that can temporarily suspend and resume an operation of integrating an input current, and measure ambient brightness accurately without using an optical filter.

Figure 25:
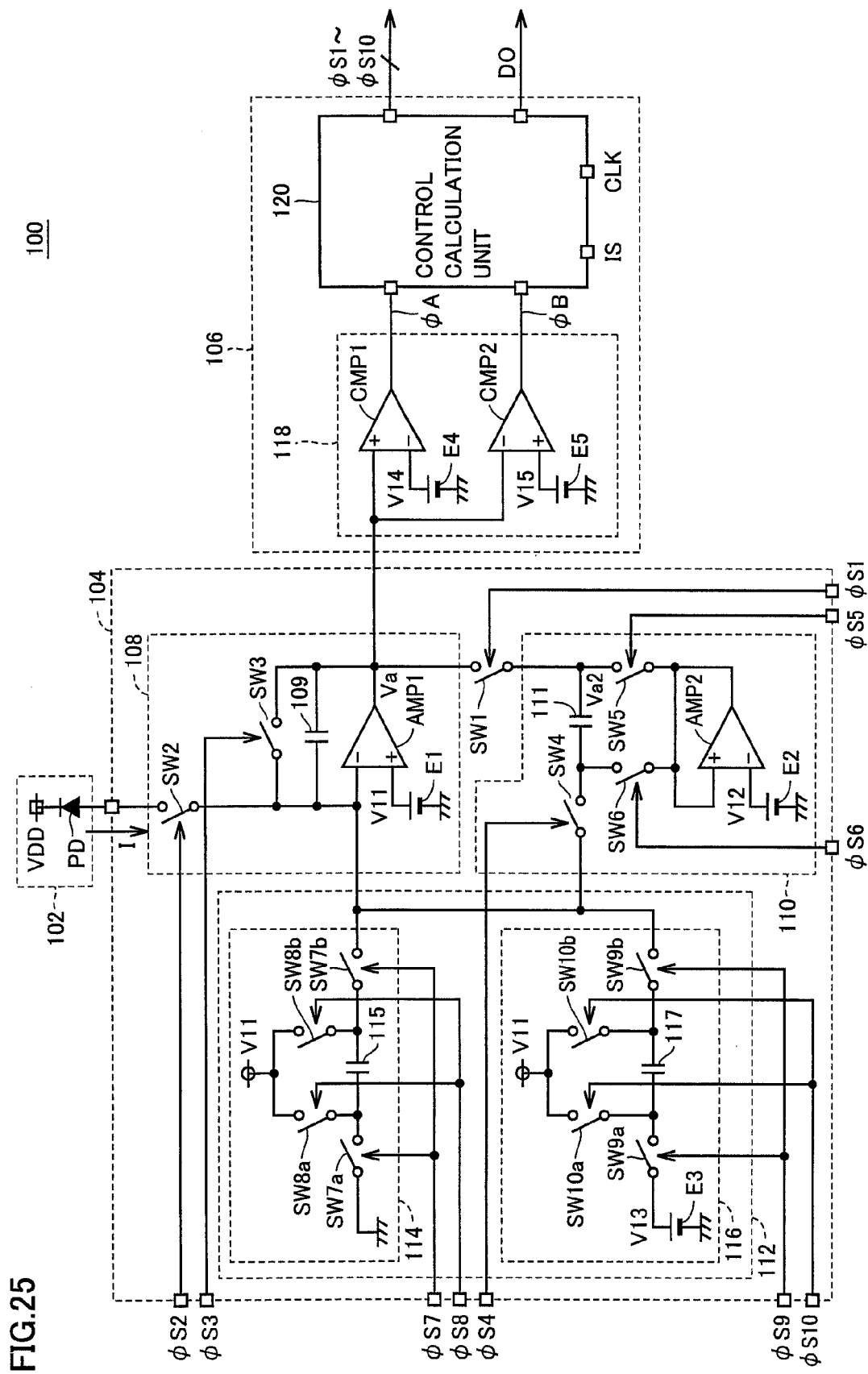
FIG. 25 is a block diagram showing a configuration of an illuminance sensor in accordance with Embodiment 4 of the present invention.

FIG. 25 is a circuit diagram showing a configuration of an illuminance sensor 100 using an analog/digital converter in accordance with Embodiment 4 of the present invention. Hereinafter, Embodiment 4 of the present invention will be described.

Illuminance sensor 100 includes a photosensor unit 102, a charging/discharging unit 104, and an analog/digital conversion unit 106. An output current I of photosensor unit 102 is input to charging/discharging unit 104, an analog signal output from charging/discharging unit 104 is input to analog/digital conversion unit 106, and analog/digital conversion unit 106 outputs digital signal DO and control signals φS1 to φS10 controlling charging/discharging unit 104. Charging/discharging unit 104 and analog/digital conversion unit 106 constitute an integral analog/digital converter.

Photosensor unit 102 includes a photodiode PD, detects light with photodiode PD, and outputs current I in accordance with light intensity. Photodiode PD has a cathode receiving power supply voltage VDD, and an anode connected to charging/discharging unit 104.

Charging/discharging unit 104 includes charging circuits 108, 110, a discharging unit 112, and switch SW1. Switch SW1 has one terminal connected to an output terminal of charging circuit 108, and the other terminal connected to an output terminal of charging circuit 110, and switch SW1 opens/closes based on control signal φS1. When switch SW1 is turned on, a voltage Va at the output terminal of charging circuit 108 becomes equal to a voltage Va2 at the output terminal of charging circuit 110.

Analog/digital conversion unit 106 converts the analog signal as output voltage Va of charging circuit 108 into digital signal DO, and outputs digital signal DO. Analog/digital conversion unit 106 includes a comparison unit 118 and a control calculation unit 120.

Charging circuit 108 is a circuit accumulating charges in accordance with the input current, that is, current I output by photodiode PD. Charging circuit 108 has an operational amplifier AMP1, a charging capacitor 109 having one terminal connected to an inverting input terminal of operational amplifier AMP1 and the other terminal connected to an output terminal of operational amplifier AMP1, and a constant voltage source E1 applying a reference voltage V11 to a non-inverting input terminal of operational amplifier AMP1. Charging circuit 108 further includes switch SW2 opening/closing between an input terminal from which current I is input, that is, the anode of photodiode PD, and the inverting input terminal of operational amplifier AMP1 based on control signal φS2, and a switch SW3 opening/closing between the terminals of charging capacitor 109 based on control signal φS3.

Charging circuit 110 is a circuit accumulating charges in a charging capacitor 111 in accordance with the charges accumulated in charging capacitor 109. Charging circuit 110 includes charging capacitor 111 having one terminal connected to the output terminal of charging circuit 110, a switch SW4 opening/closing between the inverting input terminal of operational amplifier AMP1 and the other terminal of charging capacitor 111 based on control signal φS4, and an operational amplifier AMP2 having an output terminal connected to an inverting input terminal. Charging circuit 110 further includes a constant voltage source E2 applying a reference voltage V12 to a non-inverting input terminal of operational amplifier AMP2, a switch SW5 opening/closing based on control signal φS5 and having one terminal connected to the output terminal of charging circuit 110 and the other terminal connected to the output terminal of operational amplifier AMP2, and a switch SW6 opening/closing based on control signal φS6 and having one terminal connected to a connection point between switch SW4 and charging capacitor 111 and the other terminal connected to the output terminal of operational amplifier AMP2.

Discharging unit 112 includes a discharging circuit 114 and a discharging circuit 116. These two discharging circuits 114, 116 are connected to charging circuits 108, 110. Therefore, discharging unit 112 can discharge the charges accumulated in charging circuits 108, 110. However, in Embodiment 4, discharging unit 112 is configured to discharge the charges accumulated in charging circuit 108.

Discharging circuit 114 is a circuit discharging the charges accumulated in charging circuit 108 every time when a charging amount of charging circuit 108 reaches a predetermined threshold. Discharging circuit 114 includes a discharging capacitor 115 having a capacitance value that is $1/m$ ($m>1$) a capacitance value of charging capacitor 109, and switches SW7a, SW7b, SW8a, SW8b. Switch SW7a opens/closes between one terminal of discharging capacitor 115 and a node of the ground voltage based on control signal φS7. Switch SW7b opens/closes between the other terminal of discharging capacitor 115 and the inverting input terminal of operational amplifier AMP1 based on control signal φS7. Switch SW8a opens/closes between one terminal of discharging capacitor 115 and a node of reference voltage V11 based on control signal φS8. Switch SW8b opens/closes between the other terminal of discharging capacitor 115 and the node of reference voltage V11 based on control signal φS8.

Discharging circuit 116 is means for discharging the charges remaining in charging circuit 108 in a stepwise manner by a predetermined amount until the charges reach a predetermined value, using a discharging capacitor 117 having a capacitance smaller than that of discharging capacitor 115 in discharging circuit 114. Further, discharging circuit 116 has discharging capacitor 117 having a capacitance that is $1/n$ ($n>m$) that of charging capacitor 109, and a constant voltage source E3 generating a reference voltage V13 that is $1/k$ ($k>1$) reference voltage V11.

Discharging circuit 116 further includes switches SW9a, SW9b, SW10a, SW10b. Switch SW9a opens/closes between one terminal of discharging capacitor 117 and a positive terminal of constant voltage source E3 based on control signal φS9. Switch SW9b opens/closes between the other terminal of discharging capacitor 117 and the inverting input terminal of operational amplifier AMP1 based on control signal φS9. Switch SW10a opens/closes between one terminal of discharging capacitor 117 and the node of reference voltage V11 based on control signal φS10. Switch SW10b opens/closes between the other terminal of discharging capacitor 117 and the node of reference voltage V11 based on control signal φS10.

Comparison unit 118 compares output voltage Va of charging circuit 108 with each of reference voltages V14, V15. Comparison unit 118 includes a constant voltage source E4 generating reference voltage V14, a constant voltage source E5 generating reference voltage V15, a comparator CMP1 having a non-inverting input terminal receiving output voltage Va of charging circuit 108 and an inverting input terminal receiving output voltage V14 of constant voltage source E4, and a comparator CMP2 having an inverting input terminal receiving output voltage Va of charging circuit 108 and a non-inverting input terminal receiving output voltage V15 of constant voltage source E5.

Control calculation unit 120 receives clock signal CLK, an instruction signal IS, and output signals φA, φB of comparators CMP1, CMP2, generates control signals φS1 to φS10 based on these signals, and controls charging/discharging operations of charging circuits 108, 110 and discharging circuits 114, 116.

Further, control calculation unit 120 calculates a total charging amount of charging circuit 108 from the number in which charging capacitor 109 is discharged by discharging circuits 114, 116, and outputs digital signal DO indicating a calculation result. Clock signal CLK and instruction signal IS are input, for example, from a microcomputer not shown. Although control calculation unit 120 and the microcomputer not shown are described as being separate for convenience of explanation, control calculation unit 120 may be housed in the microcomputer.

Each of switches SW1 to SW10 is composed of an N channel or P channel MOS transistor. Control signals φS1 to φS10 are supplied to gate electrodes of switches SW1 to SW10, respectively. Each of switches SW1 to SW10 may be composed of an NPN or PNP bipolar transistor, and control signals φS1 to φS10 may be supplied to base electrodes thereof, respectively.

In Embodiment 4, reference voltages V11, V12, and V14 are set to the same voltage VR. Reference voltages V13 and V15 are set to the same voltage VR/2. In addition, the capacitance values of charging capacitors 109 and 111 are set to the same value. For example, the capacitance values of charging capacitors 109 and 111 are both set to 64 pF, the capacitance value of discharging capacitor 115 is set to 32 pF, and the capacitance value of discharging capacitor 117 is set to 1 pF. Since the capacitance values of charging capacitors 109 and 111 are equal, when switch SW1 is turned on, charges equal to the charges accumulated in charging capacitor 109 are accumulated in charging capacitor 111.

With the above configuration that two discharging paths (discharging circuits 114, 116) are provided, the capacitance value of discharging capacitor 115 in discharging circuit 114 is set, for example, to 32 pF, and the capacitance value of discharging capacitor 117 in discharging circuit 116 is set, for example, to 1 pF such that the capacitance values of discharging capacitors 115, 117 are different approximately by an order of magnitude, it is possible to selectively use discharging circuit 114 that discharges the charges accumulated in charging capacitor 109 in a large amount at once, and discharging circuit 116 that discharges the charges in a small amount at once.

In order to measure the total charging amount of charging circuit 108, firstly the charge amount is roughly measured by performing discharging by discharging circuit 114, and after input of current I to charging circuit 108 is terminated, the charges remaining in charging capacitor 109 is discharged by discharging circuit 116 to minutely measure the charge amount. Thereby, accuracy of illuminance sensor 100 can be improved and measurement time can be reduced without a need for complicated external control, when compared with a case where only one discharging circuit is provided.

An operation of illuminance sensor 100, in particular a charging/discharging operation in charging/discharging unit 104, will now be described with reference to FIGS. 25 to 27.

Figure 26:
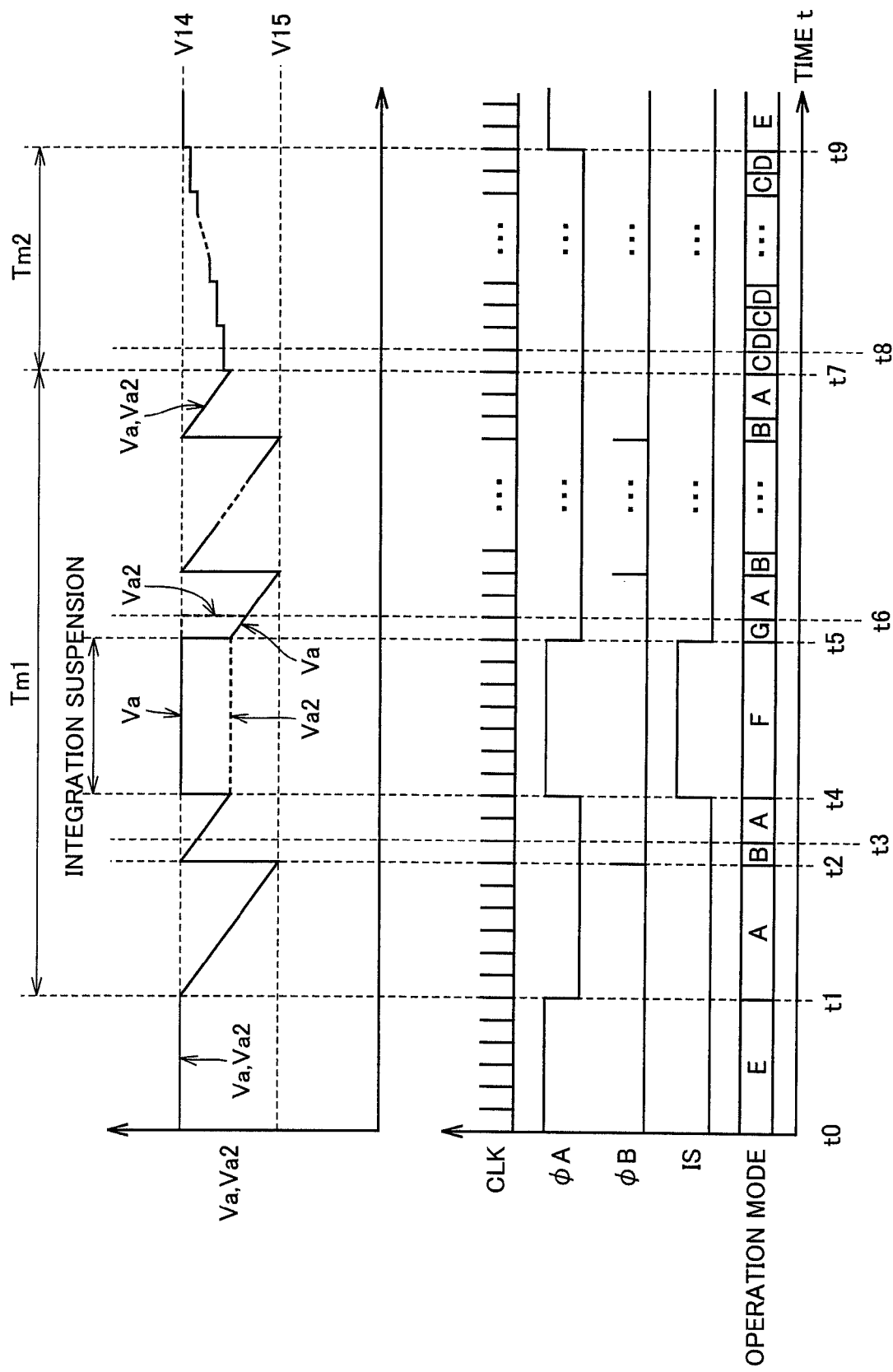
FIG. 26 is a time chart showing an operation of the illuminance sensor shown in FIG. 25.

FIG. 26 is a time chart showing an example of the charging/discharging operation in charging/discharging unit 104. An upper portion of FIG. 26 shows transitions of output voltage Va of charging circuit 108 and output voltage Va2 of charging circuit 110 with respect to passage of time t, and a lower portion of FIG. 26 shows transitions of clock signal CLK, output signals φA, φB of comparators CMP1, CMP2, instruction signal IS, and the operation modes with respect to passage of time t.

Here, instruction signal IS is a signal input from the microcomputer not shown to control calculation unit 120, and is used to control an integration operation of illuminance sensor 100. If instruction signal IS attains, for example, an "H" level, illuminance sensor 100 suspends the integration operation, and if instruction signal IS shifts from an "H" level to an "L" level, illuminance sensor 100 resumes the integration operation.

A period Tm1 represents a period for which current I is input to charging circuit 108. Illuminance sensor 100 inputs current I to charging circuit 108, and charges electric charges in charging capacitor 109. When the charges are accumulated in charging capacitor 109 in a certain amount, illuminance sensor 100 uses discharging circuit 114 to discharge the charges accumulated in charging capacitor 109, and resumes charging. Further, the integration operation of illuminance sensor 100 is controlled by instruction signal IS.

Period Tm1 and the input of current I to charging circuit 108 are terminated when the number of pulses of clock signal CLK from the microcomputer not shown reaches a predetermined count number. However, in a case where illuminance sensor 100 suspends the integration operation, counting of pulses of clock signal CLK is suspended. After termination of period Tm1, illuminance sensor 100 shifts to a period Tm2.

Period Tm2 is a period for measuring the charges accumulated in charging circuit 108 when period Tm1 is terminated. Illuminance sensor 100 terminates the input of current I to charging circuit 108, and discharges the charges accumulated in charging capacitor 109 little by little by discharging circuit 116. The amount of the charges accumulated in charging capacitor 109 when the input of current I to charging circuit 108 is terminated is measured by repeating the discharging by discharging circuit 116. Period Tm2 is terminated when all charges remaining in charging capacitor 109 are discharged.

FIG. 27 is a table showing states of switches SW in operation modes A to G. In the "charging mode for capacitor 109" in the column "operational detail" in FIG. 27, charges are accumulated in charging capacitor 109 in accordance with current I output by photodiode PD. In the "large discharging mode for capacitor 109", the charges accumulated in charging capacitor 109 are moved to discharging capacitor 115 within one clock of clock signal CLK.

In the "small discharging mode for capacitor 109", the charges accumulated in charging capacitor 109 are moved to discharging capacitor 117 within one clock of clock signal CLK, in an amount that can be accumulated in discharging capacitor 117. In the "discharging mode for capacitor 117", the charges moved to discharging capacitor 117 by the "small discharging mode for capacitor 109" are discharged within one clock of clock signal CLK.

In the "standby mode", illuminance sensor 100 in a power-on state waits for various instructions from the microcomputer not shown. In the "integration suspension mode", illuminance sensor 100 temporarily suspends an operation of integrating current I output by photodiode PD. In the "integration resumption mode", illuminance sensor 100 resumes the integration operation temporarily suspended by the "integration suspension mode".

When illuminance sensor 100 is powered on at a time point t0, illuminance sensor 100 enters operation mode E (the standby mode). Operation mode E continues from time point t0 to time point t1. Control calculation unit 120 sends control signals φS1 to φS10 to charging/discharging unit 104.

In operation mode E, as shown in FIG. 27, switches SW1, SW2, SW4, SW7a, SW7b, SW9a, SW9b are off. In addition, switches SW3, SW5, SW6, SW8a, SW8b, SW10a, SW10b are on. On this occasion, switches SW1, SW4 may be on, and switches SW5, SW6 may be off.

In operation mode E, a path through which current I output by photodiode PD is input to charging circuit 108 is blocked, and the charges in any of charging capacitors 109, 111 and discharging capacitors 115, 117 are discharged. On this occasion, output voltage Va of charging circuit 108 becomes equal to reference voltage V11 (reference voltage V14). Since output voltage Va of charging circuit 108 is equal to reference voltage V14, output signal φA of comparator CMP1 attains an "H" level.

At time point t1, when a measurement instruction is provided from the microcomputer not shown connected to illuminance sensor 100 to illuminance sensor 100, control calculation unit 120 sends control signals φS1 to φS10 designating operation mode A, that is, the charging mode for charging capacitor 109, to cause illuminance sensor 100 to measure ambient brightness.

Thereby, illuminance sensor 100 starts measuring the ambient brightness. Illuminance sensor 100 turns on switch SW2, inputs current I output by photodiode PD to charging circuit 108, and shifts to period Tm1.

In operation mode A, as shown in FIG. 27, switches SW1, SW2, SW6, SW8a, SW8b, SW10a, SW10b are on. In addition, switches SW3, SW4, SW5, SW7a, SW7b, SW9a, SW9b are off. It is to be noted that, in operation mode A, the states of switches SW1, SW2, SW3, SW5 vary from those in operation mode E.

In operation mode A, the path through which current I output by photodiode PD is input to charging circuit 108 becomes conductive, and charging of charging capacitor 109 is started. As a result, as the charging of charging capacitor 109 proceeds, output voltage Va of charging circuit 108 is reduced.

In addition, since switch SW1 is on, output voltage Va of charging circuit 108 becomes equal to output voltage Va2 of charging circuit 110. Since charging capacitor 109 and charging capacitor 111 have the same capacitance of 64 pF in Embodiment 4, the both capacitors hold equal charges. When charging of charging circuit 108 is started and output voltage Va of charging circuit 108 becomes smaller than reference voltage V14, output signal φA of comparator CMP1 attains an "L" level.

Further, in operation mode A, charging capacitor 109 is charged, and discharging capacitors 115, 117 are discharged.

At time point t2, the charging of charging capacitor 109 proceeds, output voltage Va of charging circuit 108 is reduced to reference voltage V15, and output signal φB of comparator CMP2 transitions from the previous "L" level to an "H" level. On this occasion, control calculation unit 120 sends control signals φS1 to φS10 designating operation mode B, that is, the large discharging mode for charging capacitor 109, and further counts the number of shifts to operation mode B.

In operation mode B, as shown in FIG. 27, switches SW1, SW2, SW6, SW7a, SW7b, SW10a, SW10b are on. In addition, switches SW3, SW4, SW5, SW8a, SW8b, SW9a, SW9b are off. It is to be noted that, in operation mode B, the states of switches SW7a, SW7b, SW8a, SW8b vary from those in operation mode A.

In operation mode B, a charge transfer path from charging capacitor 109 to discharging capacitor 115 becomes conductive, and the charges accumulated in charging capacitor 109 is transferred to discharging capacitor 115. Since switch SW1 is on, output voltage Va2 of charging circuit 110 varies in accordance with output voltage Va of charging circuit 108. It is to be noted that output signal φB of comparator CMP2 attains an "L" level if output voltage Va of charging circuit 108 is not less than reference voltage V15.

Since charging capacitor 109 has a capacitance of 64 pF and reference voltage V11 is equal to VR, a charge amount Q1 held by charging capacitor 109 at the start of operation mode B is represented as Q1=64 pF×(VR−Va). In addition, since discharging capacitor 115 has a capacitance of 32 pF, a charge amount Q3 that can be held by discharging capacitor 115 is represented as Q3=32 pF×VR.

As described above, even if the capacitance value of discharging capacitor 115 is half the capacitance value of charging capacitor 109, when the voltage across the terminals of discharging capacitor 115 is twice the voltage across the terminals of charging capacitor 109 at the start of operation mode B, discharging capacitor 115 can accumulate charges in an amount equal to that in charging capacitor 109.

Therefore, since the charges accumulated in charging capacitor 109 are transferred to discharging capacitor 115 by 32 pF×VR in operation mode B, output voltage Va of charging circuit 108 is increased by a given value in operation mode B starting from time point t2. The transfer of the charges from charging capacitor 109 to discharging capacitor 115 is terminated in a significantly short time, when compared with time taken to charge charging capacitor 109 in operation mode A.

Also during operation mode B, the input of current I output by photosensor unit 102, that is, the charging of charging capacitor 109 is continued. When the operation mode is caused to transition in synchronization with clock signal CLK, output voltage Va of charging circuit 108 becomes equal to reference voltage V15, that is, not more than VR/2, at the start of operation mode B. Therefore, output signal φA of comparator CMP1 is continuously maintained at an "L" level. In Embodiment 4, operation mode B is terminated in one clock of clock signal CLK.

At time point t3, when next clock signal CLK rises after the start of operation mode B, control calculation unit 120 terminates operation mode B, and sends control signals φS1 to φS10 designating operation mode A again to charging/discharging unit 104.

After time point t3, every time when the charge amount in charging circuit 108 reaches a predetermined value and output voltage Va of charging circuit 108 reaches a predetermined threshold voltage, the charges accumulated in charging circuit 108 are discharged using discharging circuit 114.

At time point t4, when instruction signal IS attains, for example, an "H" level while operation mode A is performed, control calculation unit 120 sends control signals φS1 to φS10 designating operation mode F, that is, the integration suspension mode.

In operation mode F, as shown in FIG. 27, switches SW1, SW4, SW5, SW7a, SW7b, SW9a, SW9b are off. In addition, switches SW2, SW3, SW6, SW8a, SW8b, SW10a, SW10b are on. It is to be noted that, in operation mode F, the states of switches SW1, SW3 vary from those in operation mode A.

In operation mode F, the output terminal of charging circuit 108 is disconnected from the output terminal of charging circuit 110 by switch SW1, and charging circuit 110 is further disconnected from other circuits by switches SW1, SW4. Therefore, output voltage Va2 of charging circuit 110 is maintained at a voltage at the start of operation mode F. Output voltage Va2 of charging circuit 110 is also equal to output voltage Va of charging circuit 108 at the start of operation mode F.

Further, in operation mode F, since switch SW3 is on, output voltage Va of charging circuit 108 becomes equal to reference voltage V11 (reference voltage V14), and output signal φA of comparator CMP1 attains an "H" level.

Through these operations, illuminance sensor 100 suspends the operation of integrating current I output by photosensor unit 102. Further, since switches SW2, SW3 are on, accumulation of charges in parasitic capacitances of the switches themselves can be prevented.

At time point t5, when operation mode F, that is, the integration suspension mode, is terminated and the next integration resumption mode is started, instruction signal IS is caused to transition from an "H" level to an "L" level, Thereby, when illuminance sensor 100 resumes the integration operation, control calculation unit 120 sends control signals φS1 to φS10 designating operation mode G, that is, the integration resumption mode, to resume the suspended integration operation.

In operation mode G, as shown in FIG. 27, switches SW1, SW3, SW6, SW7a, SW7b, SW9a, SW9b are off. In addition, switches SW2, SW4, SW5, SW8a, SW8b, SW10a, SW10b are on. It is to be noted that, in operation mode G, the states of switches SW3, SW4, SW5, SW6 vary from those in operation mode F.

In operation mode G, the charges accumulated in charging capacitor 111 are transferred to charging capacitor 109. In operation mode F, since output voltage Va2 of charging circuit 110 is maintained at output voltage Va of charging circuit 108 at the start of operation mode F, the charges held by charging capacitor 111 can be transferred to charging capacitor 109. Thereby, output voltage Va of charging circuit 108 can be returned to output voltage Va of charging circuit 108 immediately before illuminance sensor 100 suspends the integration operation.

Since switch SW5 is on in operation mode G, output voltage Va2 of charging circuit 110 becomes equal to reference voltage V11 (reference voltage V14). Further, since switch SW2 is on and switch SW3 is off, the charging of charging capacitor 109 is resumed.

The transfer of the charges from charging capacitor 111 to charging capacitor 109 in operation mode G is terminated in a significantly short time, when compared with the charging time taken in operation mode A. In Embodiment 4, operation mode G is terminated in one clock period of clock signal CLK.

After operation mode G is terminated, if output signal φB of comparator CMP2 is at an "H" level, the operation mode shifts to operation mode B, if the counted value of pulses of clock signal CLK to illuminance sensor 100 reaches a predetermined value and thus period Tm1 is terminated, the operation mode shifts to operation mode C, and otherwise, the operation mode shifts to operation mode A.

At time point t6, when operation mode A is started after termination of operation mode G, switch SW1 is on, and thus output voltage Va2 of charging circuit 110 becomes equal to output voltage Va of charging circuit 108. Since switch SW1 is also on in a case where operation mode B or operation mode C is started after the termination of operation mode G, output voltage Va2 of charging circuit 110 becomes equal to output voltage Va of charging circuit 108.

At time point t7, when the counted value of pulses of clock signal CLK in operation mode A, operation mode B, and operation mode G reaches a predetermined value after illuminance sensor 100 shifts to period Tm1, illuminance sensor 100 shifts from period Tm1 to period Tm2.

When period Tm2 is started, control calculation unit 120 sends control signals φS1 to φS10 designating operation mode C, that is, the small discharging mode for charging capacitor 109, to charging/discharging unit 104, and further counts the number of shifts to operation mode C.

In operation mode C, as shown in FIG. 27, switches SW1, SW6, SW8a, SW8b, SW9a, SW9b are on. In addition, switches SW2, SW3, SW4, SW5, SW7a, SW7b, SW10a, SW10b are off. It is to be noted that, in operation mode C, the states of switches SW2, SW9a, SW9b, SW10a, SW10b vary from those in operation mode A.

In operation mode C, the path through which current I output by photodiode PD is input to charging circuit 108 is blocked. At the same time, a charge transfer path from charging capacitor 109 to discharging capacitor 117 becomes conductive, and a given amount of the charges accumulated in charging capacitor 109 is transferred to discharging capacitor 117.

Since charging capacitor 109 has a capacitance of 64 pF and reference voltage V11 is equal to VR, charge amount Q1 held by charging capacitor 109 at the start of operation mode C is represented as Q1=64 pF×(VR−Va). In addition, since discharging capacitor 117 has a capacitance of 1 pF and reference voltage V15 is equal to VR/2, a charge amount Q4 that can be held by discharging capacitor 117 is represented as Q4=1 pF×VR/2.

Specifically, since the charges held by charging capacitor 109 are transferred to discharging capacitor 117 by 1 pF×VR/2 in operation mode C, output voltage Va of charging circuit 108 is increased by that amount. The transfer of the charges from charging capacitor 109 to discharging capacitor 117 is terminated in a significantly short time, when compared with the time taken to charge charging capacitor 109 in operation mode A.

At time point t8, when next clock signal CLK rises after the start of operation mode C, control calculation unit 120 sends control signals φS1 to φS10 designating operation mode D, that is, the discharging mode for discharging capacitor 117, to charging/discharging unit 104, to discharge the charges transferred from charging capacitor 109 to discharging capacitor 117.

In operation mode D, as shown in FIG. 27, switches SW1, SW6, SW8a, SW8b, SW10a, SW10b are on. In addition, switches SW2, SW3, SW4, SW5, SW7a, SW7b, SW9a, SW9b are off. It is to be noted that, in operation mode D, the states of switches SW9a, SW9b, SW10a, SW10b vary from those in operation mode C.

In operation mode D, the charge transfer path from charging capacitor 109 to discharging capacitor 117 is blocked, and discharging capacitor 117 is discharged. In period Tm2, operation mode C and operation mode D are repeated to discharge the charges remaining in charging circuit 108 using discharging circuit 116, little by little by a predetermined amount, until the remaining charges reach a predetermined value.

It is to be noted that, in period Tm2, one clock period of clock signal CLK is required to transfer the charges from charging capacitor 109 to discharging capacitor 117, and one clock period of clock signal CLK is required to discharge the charges in discharging capacitor 117. Since the capacitance value of discharging capacitor 117 is one sixty-fourth the capacitance value of charging capacitor 109, period Tm2 can be a maximum of 128 clock periods.

At time point t9, when output voltage Va of charging circuit 108 reaches reference voltage V14, output signal φA of comparator CMP1 is caused to transition from an "L" level to an "H" level. On this occasion, since output signal φA of comparator CMP1 attains an "H" level in period Tm2, control calculation unit 120 sends control signals φS1 to φS10 designating operation mode E, to terminate period Tm2. Thereby, a series of charging/discharging operations described above is completed.

Further, at time point t9, control calculation unit 120 obtains the number in which charging capacitor 109 is discharged using discharging circuit 114 and discharging circuit 116 from counted results of the number of shifts to operation mode B and the number of shifts to operation mode C, and calculates the total charging amount of charging circuit 108. Control calculation unit 120 calculates ambient brightness of illuminance sensor 100 from the total charging amount of charging circuit 108, and outputs digital signal DO.

After period Tm2 is terminated and the ambient brightness is output as digital signal DO, illuminance sensor 100 stands by until various instructions are supplied from the microcomputer not shown connected to illuminance sensor 100, and if a measurement instruction is supplied, illuminance sensor 100 shifts to period Tm1 and performs the aforementioned operations thereafter.

By repeating the operations from time point t1 to time point t9 described above, even when illuminance sensor 100 suspends the operation of integrating current I output by photodiode PD, charging circuit 108 can return to a state immediately before the integration operation is suspended when the integration operation is resumed, and charging circuit 108 resumes the integration operation from the state immediately before the integration operation is suspended, and thus illuminance sensor 100 can temporarily suspend and resume the integration operation. Therefore, illuminance sensor 100 can accurately measure the ambient brightness.

Although single charging circuit 110 is used in Embodiment 4, a plurality of charging circuits 110 may be connected in parallel and the sum of capacitance values of a plurality of charging capacitors 111 may be set to be equal to the capacitance value of charging capacitor 109.

Figure 28:
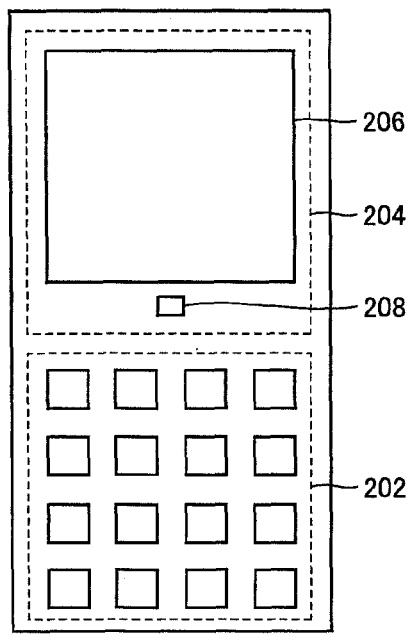
FIG. 28 is a view showing a configuration of electronic equipment provided with the illuminance sensor shown in FIG. 25.

FIG. 28 is a view showing an example of a configuration of electronic equipment 200 in accordance with the present invention. Referring to FIG. 28, the configuration of electronic equipment 200 will be described. Electronic equipment 200 includes an input device 202 and an illumination device 204.

Input device 202 is used to manipulate electronic equipment 200. Input device 202 includes, for example, a plurality of buttons. If a button is depressed, a switch is in an ON state, and if the button is released, the switch is in an OFF state. Input device 202 may also be a touch panel, a voice input device, or the like.

Illumination device 204 serves as a display device for electronic equipment 200. For example, when input device 202 is manipulated and a signal is input, illumination device 204 displays an input result.

Figure 29:
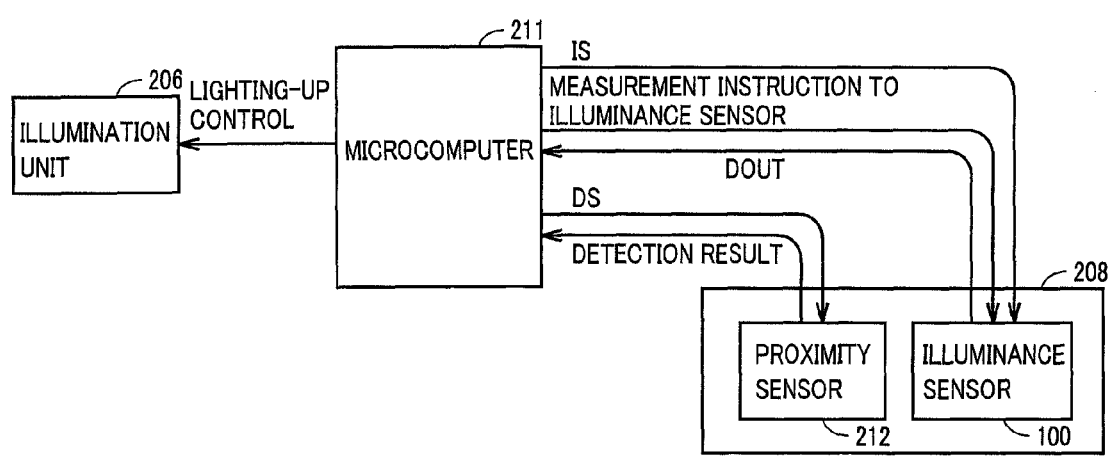
FIG. 29 is a block diagram showing a configuration of an illumination device shown in FIG. 28.

FIG. 29 is a block diagram showing a configuration of illumination device 204. As shown in FIG. 29, illumination device 204 includes an illumination unit 206, a light receiving unit 208, and a microcomputer 211. Illumination unit 206 includes, for example, a light source element such as an LED and an organic EL. Lighting up or out these light source elements is controlled by microcomputer 211.

Light receiving unit 208 includes a semiconductor device in which illuminance sensor 100 and an infrared reflective proximity sensor 212 are formed on one semiconductor substrate. Light receiving unit 208 receives ambient light, and also receives light emitted from an infrared diode of proximity sensor 212 and reflected by an object. Illuminance sensor 100 measures ambient brightness and sends a signal indicating a measurement result to microcomputer 211. Proximity sensor 212 detects whether or not the object is in the proximity of illumination device 204, and sends a signal indicating a detection result to microcomputer 211.

Microcomputer 211 performs lighting-up control of illumination unit 206 based on the measurement result of illuminance sensor 100 and the detection result of proximity sensor 212. Further, microcomputer 211 controls illuminance sensor 100 and proximity sensor 212.

Control of illuminance sensor 100, illumination unit 206, and proximity sensor 212 by microcomputer 211 will be described. To perform lighting-up control of illumination unit 206, microcomputer 211 sends a measurement instruction to illuminance sensor 100 to cause it to start measuring ambient brightness. Further, microcomputer 211 sends instruction signal IS, for example, at an "L" level, to illuminance sensor 100.

While illuminance sensor 100 is measuring the ambient brightness, microcomputer 211 sends a detection instruction DS to proximity sensor 212 to detect an object in the proximity of illumination device 204. On this occasion, to prevent a problem that illuminance sensor 100 fails to measure the ambient brightness accurately due to light emission of the infrared diode of proximity sensor 212, microcomputer 211 causes instruction signal IS to transition, for example, from an "L" level to an "H" level simultaneously with sending detection instruction DS to proximity sensor 212. Further, illuminance sensor 100 may send detection instruction DS to proximity sensor 212 after microcomputer 211 causes instruction signal IS to transition from an "L" level to an "H" level.

In response to the transition of instruction signal IS from an "L" level to an "H" level, illuminance sensor 100 performs the integration suspension operation described above. In addition, in response to reception of detection instruction DS, proximity sensor 212 detects the presence or absence of an object in the proximity of illumination device 204, and sends the signal indicating the detection result to microcomputer 211.

Microcomputer 211 causes proximity sensor 212 to terminate the detection of an object in the proximity of illumination device 204 in a given time. When proximity sensor 212 terminates the detection, microcomputer 211 causes instruction signal IS to be sent to illuminance sensor 100 to transition from an "H" level to an "L" level. Therefore, proximity sensor 212 operates only when illuminance sensor 100 is not performing the integration operation, and illuminance sensor 100 does not perform the integration operation while proximity sensor 212 is in operation.

In response to the transition of instruction signal IS, for example, from an "L" level to an "H" level, illuminance sensor 100 resumes the integration operation described above. Then, when illuminance sensor 100 terminates measurement of the ambient brightness, illuminance sensor 100 sends the measurement result as digital signal DO to microcomputer 211.

Microcomputer 211 performs lighting-up control of illumination unit 206 based on the measurement result of illuminance sensor 100 and the detection result of proximity sensor 212. For example, microcomputer 211 adjusts brightness of illumination unit 206 in accordance with the ambient brightness, and if proximity sensor 212 detects the presence of an object in the proximity of illumination device 204, microcomputer 211 darkens illumination unit 206. By repeating the above operations, illumination unit 206 is always maintained at optimal brightness.

In Embodiment 4, electronic equipment 200 can accurately measure ambient brightness even when illuminance sensor 100 and proximity sensor 212 are arranged adjacent to each other, and can always adjust brightness of illumination unit 206 at optimal brightness based on the measurement result of illuminance sensor 100 and the detection result of proximity sensor 212.

Further, by forming illuminance sensor 100 and proximity sensor 212 on one semiconductor substrate, a semiconductor device having functions of a proximity sensor and an illuminance sensor in one chip can be provided. Since illuminance sensor 100 of the present invention does not use an optical filter, it is suitable for size reduction, and can be readily incorporated on the same semiconductor chip as infrared reflective proximity sensor 212. Using a semiconductor device in which infrared reflective proximity sensor 212 and illuminance sensor 100 in accordance with the present invention are incorporated on one chip can contribute to size reduction of the entire electronic equipment.

Further, illuminance sensor 100 in accordance with the present invention can be used adjacent to infrared reflective proximity sensor 212 with each other, and can also be used adjacent to various light emitting elements with each other to accurately measure ambient brightness by suspending the integration operation when a light emitting device lights up and resuming the integration operation when the light emitting device lights out.

Furthermore, illuminance sensor 100 and the semiconductor device in accordance with the present invention can be incorporated, for example, into an illumination device such as a display device and a backlight for keypads, and illumination device 204 in accordance with the present invention can be incorporated, for example, into electronic equipment such as a mobile phone and a portable game device, and thereby can greatly contribute to reduction of power consumption.

In particular, when the semiconductor device in accordance with the present invention in which an infrared reflective proximity sensor and an illuminance sensor are configured on one semiconductor substrate is mounted to electronic equipment mounting a touch panel as a display device, such a configuration can greatly contribute to size reduction of the electronic equipment.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The analog/digital converter of the present invention can temporarily suspend and resume the operation of integrating a current input to the analog/digital converter. When an illuminance sensor using the same is arranged adjacent to an infrared reflective proximity sensor with each other, the illuminance sensor can accurately measure ambient brightness without arranging an optical filter. Further, since no optical filter is used, manufacturing cost can be suppressed, and the illuminance sensor is advantageous for size reduction. Therefore, its industrial applicability is extremely high.

Further, since using a semiconductor device in which the illuminance sensor in accordance with the present invention and an infrared reflective proximity sensor are incorporated on one semiconductor substrate can contribute to size reduction of entire electronic equipment, its industrial applicability is extremely high.

DESCRIPTION OF THE REFERENCE SIGNS

1, 51: photoelectric converter, PS, 42: photosensor, PDA, PDB, 43, 44, 75, 76: photodiode, 2, 3, 12, 17, SW: switch, 4, 5: polarity detection circuit, 6: charge amount detection circuit, 7, 52: computation control unit, 10, 15, 21, AMP: operational amplifier, 11, 16, 22, 24, 26, 61, 62, 109, 111, 115, 117: capacitor, 13, 18, 27, 28: comparison circuit, 20, 60: integration circuit, 23, 25, 45, 46, 114, 116: discharging circuit, 30: mobile phone, 31: liquid crystal panel, 32: keypads, 33, 41, 73, 100: illuminance sensor, 34, 35: backlight, 36: control device, 47: computation unit, 48: control unit, 71, 200: electronic equipment, 72, 212: proximity sensor, 74: infrared diode, 77: object, AL: ambient light, α, β: light, 102: photosensor unit, 104: charging/discharging unit, 106: analog/digital conversion unit, 108, 110: charging circuit, 112: discharging unit, 118: comparison unit, 120: control calculation unit, 202: input device, 204: illumination device, 206: illumination unit, 208: light receiving unit, 211: microcomputer, CMP: comparator, E1 to E5: constant voltage source.

What is claimed is:

1. An illuminance sensor, comprising:
   a first photosensor outputting a current in accordance with light intensity;
   a second photosensor having a light receiving area different from that of said first photosensor, and outputting a current in accordance with light intensity;
   a first switch having a first terminal receiving the output current of said second photosensor, the first switch having second and third terminals, and the first terminal operable for connection to one of the second and third terminals based on a first control signal;
   a first polarity detection circuit connected to the second terminal of said first switch for detecting polarity of an input current;
   a charge amount detection circuit connected to an output node of said first photosensor and the third terminal of said first switch for detecting a charge amount by integrating an input current; and
   a computation control unit outputting said first control signal based on a detection result of said first polarity detection circuit, and outputting a digital signal indicating illuminance at a location where said first and second photosensors are installed based on a detection result of said charge amount detection circuit.

2. The illuminance sensor according to claim 1, further comprising:
   a third photosensor having a light receiving area different from those of said first and second photosensors, and outputting a current in accordance with light intensity;
   a second switch having a first terminal receiving the output current of said third photosensor, the second switch having second and third terminals, and the first terminal operable for connection to one of the second and third terminals based on a second control signal; and
   a second polarity detection circuit connected to the second terminal of said second switch for detecting polarity of an input current,
   wherein said charge amount detection circuit is further connected to an output node of said third photosensor and the third terminal of said second switch, and said computation control unit further outputs said second control signal based on a detection result of said second polarity detection circuit, and outputs a digital signal indicating illuminance at a location where said first, second, and third photosensors are installed based on a detection result of said charge amount detection circuit.

3. The illuminance sensor according to claim 2, wherein each of said first, second, and third photosensors includes
   a first photodiode having maximum light sensitivity in a visible light range, and
   a second photodiode having maximum light sensitivity in an infrared light range, and
   each of said first, second, and third photosensors outputs a current as a difference between photocurrents generated in said respective first and second photodiodes.

4. The illuminance sensor according to claim 3, wherein said first photodiode has a cathode receiving a first power supply voltage and an anode connected to an output node, and said second photodiode has a cathode connected to said output node and an anode receiving a second power supply voltage lower than said first power supply voltage.

5. The illuminance sensor according to claim 1, wherein said charge amount detection circuit includes
   a first capacitor,
   a first charging circuit charging said first capacitor with the input current for a predetermined charging period,
   a first discharging circuit discharging said first capacitor each time a charge amount in said first capacitor reaches a predetermined charge amount, and
   a second discharging circuit causing a given current to flow out from said first capacitor in response to termination of charging of said first capacitor by said first charging circuit, and
said computation control unit obtains the illuminance at the location where said first and second photosensors are installed based on a number in which said first capacitor is discharged by said first discharging circuit and time taken to cause all charges in said first capacitor to flow out by said second discharging circuit.

6. The illuminance sensor according to claim 5, wherein said first polarity detection circuit includes
   a second capacitor having charge accumulation capability lower than that of said first capacitor, and
   a second charging circuit charging said second capacitor with the output current of said first photosensor, said second charging circuit having an operational amplifier outputting a voltage at a level in accordance with a charge amount in said second capacitor,
said first polarity detection circuit further includes a comparison circuit outputting a signal indicating that an output current of a corresponding photosensor has positive polarity in response to the output voltage of said operational amplifier reaching a reference voltage, and
said second charging circuit stops charging said second capacitor in response to the output signal of said comparison circuit.

7. The illuminance sensor according to claim 5, wherein said first charging circuit includes an operational amplifier outputting a voltage at a level in accordance with the charge amount in said first capacitor,
said first discharging circuit includes
   a second capacitor having charge accumulation capability identical to that of said first capacitor, and
   a first transfer circuit transferring the charges in said first capacitor to said second capacitor in response to the output voltage of said operational amplifier reaching a first reference voltage, and
said second discharging circuit includes
   a third capacitor having charge accumulation capability lower than that of said first capacitor, and
   a second transfer circuit transferring the charges in said first capacitor to said third capacitor in a predetermined cycle, and stopping transfer of the charges in response to the output voltage of said operational amplifier reaching a second reference voltage.

8. The illuminance sensor according to claim 5, wherein said computation control unit
   controls each of said first charging circuit, said first discharging circuit, and said second discharging circuit of said charge amount detection circuit,
   divides said predetermined charging period into a plurality of periods, and obtains a monitor value of said illuminance each time a period other than a last period is terminated based on the number in which said first capacitor is discharged by said first discharging circuit, to determine whether or not the obtained monitor value exceeds a value predetermined for the period,
   if said monitor value exceeds said predetermined value, said computation control unit terminates the charging of said first capacitor, causes the given current to flow out from said first capacitor by said second discharging circuit, and obtains said illuminance based on charging time for said first capacitor, the number in which said first capacitor is discharged, and the time taken to cause all charges in said first capacitor to flow out by said second discharging circuit, and
   if said monitor value does not exceed said predetermined value, said computation control unit continues the charging of said first capacitor.

9. The illuminance sensor according to claim 1, wherein said charge amount detection circuit includes
   a first capacitor having a first capacitance value,
   a second capacitor having a second capacitance value higher than said first capacitance value,
   a first charging circuit charging said first capacitor with the input current for a predetermined charging period,
   a second charging circuit charging said second capacitor to a voltage identical to that of said first capacitor for said charging period, and
   a discharging circuit discharging said first capacitor each time a charge amount in said first capacitor reaches a predetermined charge amount during said charging period, and causing a given current to flow out from said first and second capacitors after termination of said charging period, and
said computation control unit obtains the illuminance at the location where said first and second photosensors are installed based on a number in which said first capacitor is discharged within said charging period and time taken to cause all charges in said first and second capacitors to flow out after the termination of said charging period.

10. The illuminance sensor according to claim 9, wherein said first charging circuit includes
    a second switch having one terminal receiving said input current and the other terminal connected to one terminal of said first capacitor, and being conductive for said charging period, and
    an operational amplifier having an inverting input terminal connected to one terminal of said first capacitor, an output terminal connected to the other terminal of said first capacitor and one terminal of said second capacitor, and a non-inverting input terminal receiving a first reference voltage, and
said second charging circuit includes
    a third switch having one terminal receiving said first reference voltage and the other terminal connected to the other terminal of said second capacitor, and being conductive for said charging period, and
    a fourth switch connected between the other terminal of said second capacitor and one terminal of said first capacitor, and being conductive after the termination of said charging period.

11. The illuminance sensor according to claim 10, wherein said discharging circuit includes
    a third capacitor having a third capacitance value lower than said second capacitance value,
    a fifth switch connected in series with said third capacitor between the inverting input terminal of said operational amplifier and a node of a second reference voltage, and a sixth switch connected between terminals of said third capacitor, if one of said fifth and sixth switches becomes conductive, the other thereof becomes nonconductive, during said charging period, said fifth switch becomes conductive each time the charge amount in said first capacitor reaches said predetermined charge amount, and all charges in said first capacitor are transferred to said third capacitor at once, after the termination of said charging period, said fifth switch becomes conductive in a given cycle and the charges in said first and second capacitors are transferred to said third capacitor until no charge remains in said first and second capacitors, and said computation control unit obtains the illuminance at the location where said first and second photosensors are installed based on the number in which said first capacitor is discharged within said charging period and a number in which the charges in said first and second capacitors are transferred to said third capacitor after the termination of said charging period.

12. The illuminance sensor according to claim 1, wherein said charge amount detection circuit includes
a first charging circuit accumulating charges in accordance with the input current,
a second charging circuit accumulating charges in accordance with the charges accumulated in said first charging circuit, and
a second switch having one terminal connected to an output terminal of said first charging circuit and the other terminal connected to an output terminal of said second charging circuit.

13. The illuminance sensor according to claim 12, wherein said charge amount detection circuit further includes a discharging unit discharging the charges accumulated in said first charging circuit.

14. The illuminance sensor according to claim 13, wherein said first charging circuit includes
a first operational amplifier having an output terminal connected to one terminal of said second switch and a non-inverting input terminal receiving a first reference voltage,
a first charging capacitor connected between an inverting input terminal and the output terminal of said first operational amplifier,
a third switch opening/closing between an input terminal of said first charging circuit receiving said input current and the inverting input terminal of said first operational amplifier, and
a fourth switch opening/closing between terminals of said first charging capacitor.

15. The illuminance sensor according to claim 14, wherein said second charging circuit includes
a fifth switch having one terminal connected to the inverting input terminal of said first operational amplifier,
a second charging capacitor connected between the other terminal of said fifth switch and the other terminal of said first switch,
a second operational amplifier having an output terminal connected to an inverting input terminal, and a non-inverting input terminal receiving a second reference voltage,
a sixth switch opening/closing between the other terminal of said second switch and the output terminal of said second operational amplifier, and a seventh switch opening/closing between the other terminal of said fifth switch and the output terminal of said second operational amplifier.

16. The illuminance sensor according to claim 15, wherein said discharging unit includes first and second discharging circuits,
said first discharging circuit includes
a first discharging capacitor having a capacitance value that is $1/m$ (where $m \geqq 1$) a capacitance value of said first charging capacitor,
an eighth switch opening/closing between one terminal of said first discharging capacitor and a node of a ground voltage and opening/closing between the other terminal of said first discharging capacitor and the inverting input terminal of said first operational amplifier, and
a ninth switch opening/closing between each of one terminal and the other terminal of said first discharging capacitor and a node of said first reference voltage, and
said second discharging circuit includes
a second discharging capacitor having a capacitance value that is $1/n$ (where $n>m$) that of said first charging capacitor,
a tenth switch opening/closing between one terminal of said second discharging capacitor and the inverting input terminal of said first operational amplifier, and opening/closing between the other terminal of said second discharging capacitor and a node of a third reference voltage having a voltage value that is $1/k$ (where $k>1$) said first reference voltage, and
an eleventh switch opening/closing between each of one terminal and the other terminal of said second discharging capacitor and the node of said first reference voltage.

17. The illuminance sensor according to claim 16, wherein said charge amount detection circuit further includes
a first comparator having a non-inverting input terminal connected to the output terminal of said first operational amplifier and an inverting input terminal receiving a fourth reference voltage, and
a second comparator having a non-inverting input terminal connected to the output terminal of said first operational amplifier and an inverting input terminal receiving a fifth reference voltage, and
said computation control unit outputs said digital signal based on output signals of said first and second comparators.

18. The illuminance sensor according to claim 15, wherein said first charging capacitor has a capacitance value equal to a capacitance value of said second charging capacitor, and
the charges in an amount equal to that of the charges accumulated in said first charging capacitor are accumulated in said second charging capacitor.

19. The illuminance sensor according to claim 15, wherein said charge amount detection circuit includes a plurality of said second charging circuits connected in parallel, and a sum of capacitance values of a plurality of said second charging capacitors of the plurality of said second charging circuits is equal to a capacitance value of said first charging capacitor.

20. The illuminance sensor according to claim 15, wherein an operation of integrating the input current performed by said charge amount detection circuit can be resumed after being temporarily suspended.

21. Electronic equipment comprising:
the illuminance sensor according to claim 5;
a liquid crystal panel displaying an image;
a backlight supplying transmitting light to said liquid crystal panel; and
a control device controlling brightness of said backlight based on a detection result of said illuminance sensor.

22. A semiconductor device comprising:
the illuminance sensor according to claim 13;
an infrared reflective proximity sensor; and
one semiconductor substrate mounted with said illuminance sensor and said proximity sensor.

* * * * *